(12) United States Patent
Dayerizadeh et al.

(10) Patent No.: US 11,962,337 B2
(45) Date of Patent: *Apr. 16, 2024

(54) COMMUNICATIONS DEMODULATION IN WIRELESS POWER TRANSMISSION SYSTEM HAVING AN INTERNAL REPEATER

(71) Applicant: NuCurrent, Inc., Chicago, IL (US)

(72) Inventors: Alireza Dayerizadeh, Chicago, IL (US); Anna Oleksiewicz, Chicago, IL (US); Michael Katz, Glen Ellyn, IL (US); Alberto Peralta, Chicago, IL (US)

(73) Assignee: NuCurrent, Inc., Chicago, IL (US)

( * ) Notice: Subject to any disclaimer, the term of this patent is extended or adjusted under 35 U.S.C. 154(b) by 139 days.

This patent is subject to a terminal disclaimer.

(21) Appl. No.: 17/518,366

(22) Filed: Nov. 3, 2021

(65) Prior Publication Data

US 2023/0133025 A1 May 4, 2023

(51) Int. Cl.
*H04B 1/04* (2006.01)
*H02J 50/20* (2016.01)
(Continued)

(52) U.S. Cl.
CPC ............... *H04B 1/04* (2013.01); *H02J 50/20* (2016.02); *H02J 50/502* (2020.01); *H03K 3/037* (2013.01); *H03K 5/22* (2013.01)

(58) Field of Classification Search
CPC . H04B 1/04; H02J 50/20; H02J 50/502; H02J 50/80; H03K 3/037; H03K 5/22
See application file for complete search history.

(56) References Cited

U.S. PATENT DOCUMENTS 5,973,650 A 10/1999 Nakanishi
7,968,823 B2 6/2011 Gerhardinger
(Continued)

FOREIGN PATENT DOCUMENTS

CN 202475041 U 10/2012
CN 103518290 A 1/2014
(Continued)

OTHER PUBLICATIONS

International Searching Authority, PCT International Search Report and Written Opinion, PCT International Application No. PCT/US2022/048871 dated Mar. 16, 2023, 12 pages.

*Primary Examiner* — Dac V Ha
(74) *Attorney, Agent, or Firm* — Lee Sullivan Shea & Smith LLP

(57) ABSTRACT

A wireless transmission system includes a transmitter antenna configured to transmit AC wireless signals to the at least one antenna, the AC wireless signals including wireless power signals and wireless data signals, the transmitter antenna including a source coil and an internal repeater coil. The system further includes at least one sensor configured to detect electrical information associated with the electrical characteristics of the AC wireless signals at one of the source coil or the internal repeater coil. A demodulation circuit is configured to receive the electrical information from the at least one sensor at the internal repeater coil, detect a change in the electrical information, (iii) determine if the change in the electrical information meets or exceeds one of a rise threshold or a fall threshold, if the change exceeds one of the rise threshold or the fall threshold, generate an alert, and output a plurality of data alerts.

20 Claims, 21 Drawing Sheets

(51) Int. Cl.
*H02J 50/50* (2016.01)
*H03K 3/037* (2006.01)
*H03K 5/22* (2006.01)

(56) References Cited

U.S. PATENT DOCUMENTS

| | | | |
|---|---|---|---|
| 9,310,932 | B2 | 4/2016 | Bae |
| 9,312,598 | B1 | 4/2016 | Callas |
| 11,728,847 | B2* | 8/2023 | Lu .................. H04B 5/0081 |
| | | | 455/41.1 |
| 2001/0000960 | A1 | 5/2001 | Dettloff |
| 2005/0116683 | A1 | 6/2005 | Cheng et al. |
| 2009/0201116 | A1 | 8/2009 | Orihara |
| 2010/0013432 | A1 | 1/2010 | Toya et al. |
| 2010/0259217 | A1 | 10/2010 | Baarman et al. |
| 2010/0289341 | A1 | 11/2010 | Ozaki et al. |
| 2011/0104902 | A1 | 5/2011 | Yamazawa et al. |
| 2012/0063505 | A1 | 3/2012 | Okamura et al. |
| 2012/0098486 | A1 | 4/2012 | Jung |
| 2012/0119576 | A1 | 5/2012 | Kesler et al. |
| 2012/0158321 | A1 | 6/2012 | Bommer et al. |
| 2012/0161520 | A1 | 6/2012 | Koga et al. |
| 2013/0009488 | A1 | 1/2013 | Choe et al. |
| 2013/0127411 | A1 | 5/2013 | Ichikawa et al. |
| 2013/0147279 | A1 | 6/2013 | Muratov |
| 2013/0220721 | A1 | 8/2013 | Matsuda |
| 2013/0230094 | A1 | 9/2013 | Eliezer et al. |
| 2013/0257367 | A1 | 10/2013 | Someya |
| 2014/0011447 | A1 | 1/2014 | Konanur et al. |
| 2014/0152516 | A1 | 6/2014 | Kim et al. |
| 2014/0191584 | A1 | 7/2014 | Kato |
| 2014/0197694 | A1 | 7/2014 | Asanuma et al. |
| 2014/0203769 | A1 | 7/2014 | Keeling et al. |
| 2014/0203987 | A1 | 7/2014 | Itoh et al. |
| 2014/0203990 | A1 | 7/2014 | Konanur et al. |
| 2014/0300201 | A1 | 10/2014 | Ichikawa et al. |
| 2014/0339913 | A1 | 11/2014 | Tsuji et al. |
| 2014/0354220 | A1 | 12/2014 | Liu |
| 2014/0375262 | A1 | 12/2014 | Yamaguchi et al. |
| 2015/0091502 | A1 | 4/2015 | Mukherjee et al. |
| 2015/0097438 | A1 | 4/2015 | Aioanei |
| 2015/0130407 | A1 | 5/2015 | Ni et al. |
| 2015/0130409 | A1 | 5/2015 | Lee et al. |
| 2015/0155737 | A1 | 6/2015 | Mayo |
| 2015/0222148 | A1 | 8/2015 | Sampei et al. |
| 2015/0228402 | A1 | 8/2015 | Zhong et al. |
| 2015/0229158 | A1* | 8/2015 | Endo .................. H02J 50/20 |
| | | | 320/108 |
| 2015/0236513 | A1 | 8/2015 | Covic et al. |
| 2015/0280442 | A1 | 10/2015 | Graham |
| 2015/0280448 | A1 | 10/2015 | White, II |
| 2015/0371771 | A1 | 12/2015 | Abu Qahouq |
| 2015/0372495 | A1 | 12/2015 | McCauley et al. |
| 2016/0035486 | A1 | 2/2016 | Turki et al. |
| 2016/0072306 | A1 | 3/2016 | Tsuda et al. |
| 2016/0087477 | A1 | 3/2016 | Jeong et al. |
| 2016/0094046 | A1 | 3/2016 | Kato |
| 2016/0118711 | A1 | 4/2016 | Finn et al. |
| 2016/0118809 | A1 | 4/2016 | Yoshida et al. |
| 2016/0164178 | A1 | 6/2016 | Komachi et al. |
| 2016/0164332 | A1 | 6/2016 | Elkhouly et al. |
| 2016/0172104 | A1 | 6/2016 | Mirbozorgi et al. |
| 2016/0226292 | A1 | 8/2016 | Yoon |
| 2016/0248265 | A1 | 8/2016 | Oo et al. |
| 2016/0308403 | A1 | 10/2016 | Bluvshtein et al. |
| 2016/0322156 | A1* | 11/2016 | Yeh .................... H01F 38/14 |
| 2016/0372979 | A1 | 12/2016 | Yoshida |
| 2017/0018935 | A1 | 1/2017 | Georgakopoulos et al. |
| 2017/0136886 | A1 | 5/2017 | Desai et al. |
| 2017/0187238 | A1 | 6/2017 | Chong et al. |
| 2017/0194816 | A1 | 7/2017 | Tsuda et al. |
| 2017/0228721 | A1 | 8/2017 | Lee et al. |
| 2017/0244167 | A1 | 8/2017 | Mak et al. |
| 2017/0248726 | A1 | 8/2017 | Adachi |
| 2017/0256990 | A1 | 9/2017 | Maniktala |
| 2017/0264343 | A1 | 9/2017 | Mao et al. |
| 2017/0279305 | A1 | 9/2017 | Staring et al. |
| 2017/0324450 | A1 | 11/2017 | Lee et al. |
| 2017/0338562 | A1 | 11/2017 | Ozenne et al. |
| 2017/0338684 | A1 | 11/2017 | Mishriki et al. |
| 2017/0358392 | A1 | 12/2017 | Zhang et al. |
| 2018/0013310 | A1 | 1/2018 | Moussaoui et al. |
| 2018/0048177 | A1 | 2/2018 | Huang et al. |
| 2018/0159382 | A1 | 6/2018 | Lin et al. |
| 2018/0219416 | A1 | 8/2018 | Van Wageningen et al. |
| 2018/0233967 | A1 | 8/2018 | Peralta et al. |
| 2018/0269727 | A1 | 9/2018 | De Rooij et al. |
| 2018/0280707 | A1 | 10/2018 | Shellhammer |
| 2018/0301936 | A1 | 10/2018 | Lee et al. |
| 2018/0331575 | A1 | 11/2018 | Ikefuji |
| 2019/0006887 | A1 | 1/2019 | Hosotani |
| 2019/0027964 | A1 | 1/2019 | Yabumoto |
| 2019/0052116 | A1 | 2/2019 | Bae |
| 2019/0068000 | A1 | 2/2019 | De Rooij et al. |
| 2019/0081518 | A1 | 3/2019 | Park et al. |
| 2019/0147202 | A1 | 5/2019 | Harney |
| 2019/0148971 | A1 | 5/2019 | Bae |
| 2019/0173325 | A1 | 6/2019 | Ichikawa |
| 2019/0312463 | A1 | 10/2019 | Maniktala |
| 2019/0334391 | A1 | 10/2019 | Qi et al. |
| 2019/0386512 | A1 | 12/2019 | Xiong |
| 2020/0067350 | A1 | 2/2020 | Moffatt |
| 2020/0076242 | A1 | 3/2020 | Narayana Bhat et al. |
| 2020/0076244 | A1 | 3/2020 | Smith et al. |
| 2020/0102645 | A1 | 4/2020 | Wang et al. |
| 2020/0106185 | A1 | 4/2020 | Paulotto et al. |
| 2020/0111605 | A1 | 4/2020 | Chayat et al. |
| 2020/0244108 | A1 | 7/2020 | Kim et al. |
| 2020/0336012 | A1 | 10/2020 | Tamaki |
| 2020/0412157 | A1 | 12/2020 | Vlasov et al. |
| 2021/0013743 | A1 | 1/2021 | Hu et al. |
| 2021/0044154 | A1 | 2/2021 | Sherman |
| 2021/0135375 | A1 | 5/2021 | Lin et al. |
| 2021/0152027 | A1 | 5/2021 | Kanakasabai et al. |
| 2022/0014048 | A1 | 1/2022 | Zhou et al. |
| 2022/0060056 | A1 | 2/2022 | Sherman |
| 2022/0123593 | A1 | 4/2022 | Nawawi et al. |
| 2022/0134814 | A1 | 5/2022 | Iozia et al. |
| 2022/0158691 | A1 | 5/2022 | Eguchi |
| 2022/0181913 | A1 | 6/2022 | Boulanger et al. |
| 2022/0291393 | A1 | 9/2022 | Gum et al. |

FOREIGN PATENT DOCUMENTS

| | | |
|---|---|---|
| CN | 112003385 A | 11/2020 |
| CN | 112448487 A | 3/2021 |
| JP | 2013184586 A | 9/2013 |
| KR | 102204560 B1 | 1/2021 |
| WO | 2015137431 A1 | 9/2015 |
| WO | 2021141865 A1 | 7/2021 |
| WO | 2022165363 A1 | 8/2022 |

* cited by examiner

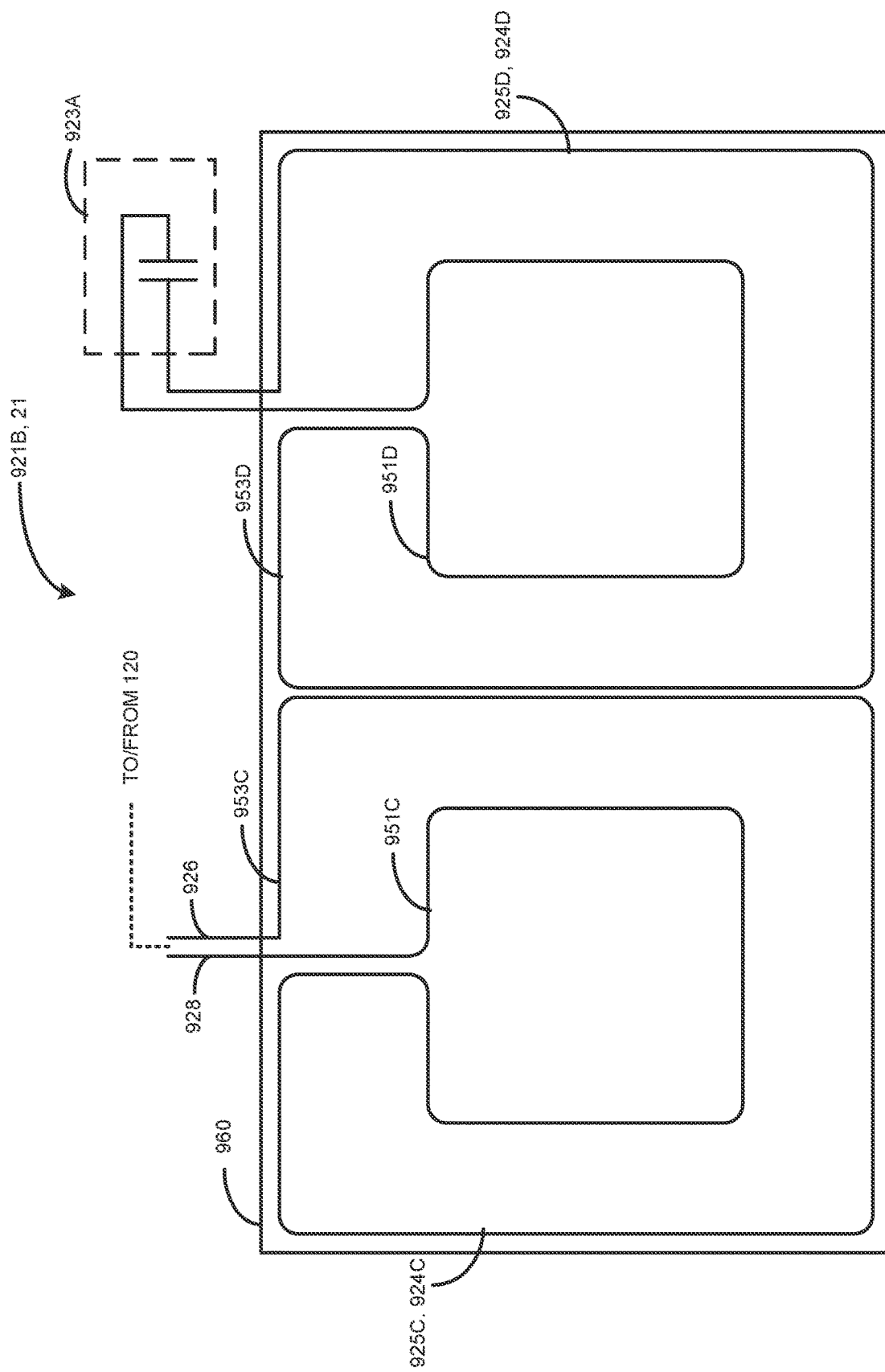

ABSTRACT

COMMUNICATIONS DEMODULATION IN WIRELESS POWER TRANSMISSION SYSTEM HAVING AN INTERNAL REPEATER

TECHNICAL FIELD

The present disclosure generally relates to systems and methods for wireless transfer of electrical power and/or electrical data signals, and, more particularly, to wireless power transfer systems configured for substantial field uniformity over a large charge area.

BACKGROUND

Wireless connection systems are used in a variety of applications for the wireless transfer of electrical energy, electrical power, electromagnetic energy, electrical data signals, among other known wirelessly transmittable signals. Such systems often use inductive and/or resonant inductive wireless power transfer, which occurs when magnetic fields created by a transmitting element induce an electric field and, hence, an electric current, in a receiving element. These transmitting and receiving elements will often take the form of coiled wires and/or antennas.

Transmission of one or more of electrical energy, electrical power, electromagnetic energy and/or electronic data signals from one of such coiled antennas to another, generally, operates at an operating frequency and/or an operating frequency range. The operating frequency may be selected for a variety of reasons, such as, but not limited to, power transfer characteristics, power level characteristics, self-resonant frequency restraints, design requirements, adherence to standards bodies' required characteristics (e.g. electromagnetic interference (EMI) requirements, specific absorption rate (SAR) requirements, among other things), bill of materials (BOM), and/or form factor constraints, among other things. It is to be noted that, "self-resonating frequency," as known to those having skill in the art, generally refers to the resonant frequency of a passive component (e.g., an inductor) due to the parasitic characteristics of the component.

When such systems operate to wirelessly transfer power from a transmission system to a receiver system via coils and/or antennas, it is often desired to simultaneously or intermittently communicate electronic data from one system to the other. To that end, a variety of communications systems, methods, and/or apparatus have been utilized for combined wireless power and wireless data transfer. In some example systems, wireless power transfer related communications (e.g., validation procedures, electronic characteristics data communications, voltage data, current data, device type data, among other contemplated data communications) are performed using other circuitry, such as optional Bluetooth chipsets and/or antennas for data communications, among other known communications circuits and/or antennas.

Further, when wireless power and data transfer is desired over a large charge or powering area, variations in strength of an emitted field, by a transmitter, may limit operations in said charge or power area.

SUMMARY

Thus, wireless power transmission systems, capable of substantially uniform or with enhanced uniformity over a large charge area, are desired. Such systems may be particularly advantageous in charging scenarios where the power receiver or device associated with the power receiver is regularly moving or in motion, during a charge cycle.

In some examples, the wireless power transmission systems may be configured to transmit power over a large charge area, within which a wireless power receiver system may receive said power. A "charge area" may be an area associated with and proximate to a wireless power transmission system and/or a transmission antenna and within said area a wireless power receiver 3 is capable of coupling with the transmission system or transmission antenna at a plurality of points within the charge area. To that end, it is advantageous, both for functionality and user experience, that the plurality of points for coupling within a charge area include as many points as possible and with as much of a consistent ability to couple with a receiver system, within the given charge area. It is advantageous for large area power transmitters to be designed with maximum uniformity of power transmission in mind. Thus, it may be advantageous to design such transmission antennas with uniformity ratio in mind. "Uniformity ratio," as defined herein, refers to the ratio of a maximum coupling, between a wireless transmission system and wireless receiver system, to a minimum coupling between said systems, wherein said coupling values are determined by measuring or determining a coupling between the systems at a plurality of points at which the wireless receiver system and/or antenna are placed within the charge area of the transmission antenna.

Further, while uniformity ratio can be enhanced by using more turns, coils, and/or other resonant bodies within an antenna, increasing such use of more conductive metals to maximize uniformity ratio may give rise to cost concerns, bill of material concerns, environmental concerns, and/or sustainability concerns, among other known drawbacks from inclusion of more conductive materials. To that end, the following transmission antennas may be designed by balancing uniformity ratio considerations with cost, environmental, and/or sustainability considerations. In other words, the following transmission antennas may be configured to achieve an increased (e.g., maximized) uniformity ratio, while reducing (e.g., minimizing) the use or the length of conductive wires and/or traces.

Large area power transmission systems may further be configured to have maximal metal resiliency. "Metal resiliency," as defined herein, refers to the ability of a transmission antenna and/or a wireless transmission system, itself, to avoid degradation in wireless power transfer performance when a metal or metallic material is present in an environment wherein the wireless transmission system operates. For example, metal resiliency may refer to the ability of wireless transmission system to maintain its inductance for power transfer, when a metallic body is present proximate to the transmission antenna. Additionally or alternatively, eddy currents generated by a metal body's presence proximate to the transmission system may degrade performance in wireless power transfer and, thus, induction of such currents are to be avoided.

Large charge area antennas may utilize internal repeaters for expanding charge area. An "internal repeater" as defined herein is a repeater coil or antenna that is utilized as part of a common antenna for a system, rather than as a repeater outside the bounds of such an antenna (e.g., a peripheral antenna for extending a signal outside the bounds of a transmission antenna's charge area). For example, a user of the wireless power transmission system would not know the difference between a system with an internal repeater and one in which all coils are wired to the transmitter electrical components, so long as both systems are housed in an opaque mechanical housing. Internal repeaters may be beneficial for use in unitary wireless transmission antennas because they allow for longer wires for coils, without introducing electromagnetic interference (EMI) that are associated with longer wires connected to a common wired signal source. Additionally or alternatively, use of internal repeaters may be beneficial in improving metal resiliency and/or uniformity ratio for the wireless transmission antenna(s) 21.

Some antennas with internal repeaters may be configured with alternating current directions of inner and outer turns. Thus, as one views the antenna both from left-to-right and from top-to-bottom, the current direction reverses from turn to turn. By reversing current directions from turn-to-turn both laterally (side to side) and from top-to-bottom, optimal field uniformity may be maintained. By reversing current directions amongst inner and outer turns, both laterally and top-to-bottom, a receiver antenna travelling across the charge area of the antenna will more often be positioned more closer-to-perpendicular with the magnetic field emanating from the antenna. Thus, as a receiver antenna will best couple with the transmission antenna at points of perpendicularity with the magnetic field, the charge area generated by the antenna will have greater uniformity than if all of the turns carried the current in a common direction.

By utilizing an internal repeater coil, rather than one larger source coil, EMI benefits may be seen, as a shorter wire connected to the source may reduce EMI issues. Additionally, by utilizing the internal repeater coil, the aforementioned reversals of current direction may be better achieved, which enhances uniformity and metal resilience in the transmission antenna.

In some examples, a repeater tuning system is disposed within or in close proximity to the internal repeater coil, rather than by routing long wires extending to a circuit board. By omitting such long wires, complexity of manufacture may be reduced. Additionally or alternatively, by shortening the connection to the tuning system by keeping it close by the internal repeater coil, EMI concerns related to long connecting wires may be mitigated.

Some internal repeater based antennas may utilize inter-turn capacitors. The use of inter-turn capacitors in the antenna may decrease sensitivity of the antenna, with respect to parasitic capacitances or capacitances outside of the scope of wireless power transfer (e.g., a natural capacitance of a human limb or body). Thus, the antenna may be less affected by such parasitic capacitances, when introduced to the field generated by the antenna, when compared to antennas not including inner turn capacitors. The inner turn capacitor, further, may be tuned to maintain phase of the AC signals throughout the respective coils and, thus, values of the inter-turn capacitors may be based on one or more of an operating frequency for the system(s), inductance of each turn of the coils, and/or length of the continuous conductive wire of a respective coil. By maintaining phase through a coil with the inter-turn capacitors, excess or unwanted E-field emissions may be mitigated, as there is less variance in voltages across a coil.

The inter-turn capacitors may be tuned to prevent E-Field emissions, such that the wireless power transmission system can properly operate within statutory or standards-body based guidelines. For example, the inter-turn capacitors may be tuned to reduce E-field emissions such that the wireless transmission system is capable of proper operations within radiation limits defined by the International Commission on Non-Ionizing Radiation Protection (ICNIRP).

Inclusion of a filter circuit associated with an internal repeater may introduce an additional impedance to the systems, which may further reduce sensitivity to parasitic capacitances within the charge area of the antenna.

Sensitive demodulation circuits that allow for fast and accurate in-band communications, regardless of the relative positions of the sender and receiver within the power transfer range, are desired. The demodulation circuit of the wireless power transmitters disclosed herein is a circuit that is utilized to, at least in part, decode or demodulate ASK (amplitude shift keying) signals down to alerts for rising and falling edges of a data signal. So long as the controller is programmed to properly process the coding schema of the ASK modulation, the transmission controller will expend less computational resources than it would if it were required to decode the leading and falling edges directly from an input current or voltage sense signal from the sensing system. To that end, the computational resources required by the transmission controller to decode the wireless data signals are significantly decreased due to the inclusion of the demodulation circuit.

This may in turn significantly reduce the BOM for the demodulation circuit, and the wireless transmission system as a whole, by allowing usage of cheaper, less computationally capable processor(s) for or with the transmission controller.

However, the throughput and accuracy of an edge-detection coding scheme depends in large part upon the system's ability to quickly and accurately detect signal slope changes. Moreover, in environments wherein the distance between, and orientations of, the sender and receiver may change dynamically, the magnitude of the received power signal and embedded data signal may also change dynamically. This circumstance may cause a previously readable signal to become too faint to discern, or may cause a previously readable signal to become saturated.

In accordance with an aspect of the disclosure, a wireless transmission system is disclosed. The system includes a transmitter antenna configured to couple with at least one other antenna of at least one other system and transmit alternating current (AC) wireless signals to the at least one antenna, the AC wireless signals including wireless power signals and wireless data signals, the wireless data signals generated by altering electrical characteristics of the AC wireless signals at the at least one other system, the transmitter antenna including a source coil and an internal repeater coil. The system further includes at least one sensor configured to detect electrical information associated with the electrical characteristics of the AC wireless signals at the internal repeater coil, the electrical information including one or more of a current of the AC wireless signals, a voltage of the AC wireless signals, a power level of the AC wireless signals, or combinations thereof. The system further includes a demodulation circuit configured to (i) receive the electrical information from the at least one sensor at the internal repeater coil, (ii) detect a change in the electrical information, (iii) determine if the change in the electrical information meets or exceeds one of a rise threshold or a fall threshold, (iv) if the change exceeds one of the rise threshold or the fall threshold, generate an alert, (v) and output a plurality of data alerts. The system further includes a transmitter controller configured to (i) receive the plurality of data alerts from the demodulation circuit, and (ii) decode the plurality of data alerts into the wireless data signals.

In a refinement, the at least one other system encodes the wireless data signals as high threshold and low threshold voltages of the AC wireless signals.

In a further refinement, the rise threshold is associated with the high threshold voltage and the fall threshold is associated with the low threshold voltage.

In another further refinement, the wireless data signals are encoded as pulse width encoded wireless data signals.

In a refinement, the wireless data signals are encoded as pulse width encoded wireless data signals and the demodulation circuit includes a slope detector circuit configured to determine a voltage rate of change for the voltage of the wireless power signals.

In a further refinement, the demodulation circuit includes a comparator circuit configured to (i) receive the voltage rate of change, (ii) compare the voltage rate of change to a rising rate of change, (iii) determine that the change in the electrical characteristics meets or exceeds the rise threshold, if the voltage rate of change meets or exceeds the rising rate of change, (iv) compare the voltage rate of change to a falling rate of change, and (v) determine that the change in the electrical characteristics meets or exceeds the fall threshold, if the voltage rate of change meets or exceeds the falling rate of change.

In yet a further refinement, the demodulation circuit includes a set/reset (SR) latch in operative communication with the comparator circuit.

In a refinement, the transmission antenna is configured to operate based on an operating frequency of about 6.78 MHz.

In accordance with another aspect of the disclosure, a wireless transmission system is disclosed. The system includes a transmitter antenna configured to couple with at least one other antenna of at least one other system and transmit alternating current (AC) wireless signals to the at least one antenna, the AC wireless signals including wireless power signals and wireless data signals, the wireless data signals generated by altering electrical characteristics of the AC wireless signals at the at least one other system, the transmitter antenna including a source coil and an internal repeater coil. The system further includes at least one sensor configured to detect electrical information associated with the electrical characteristics of the AC wireless signals at the source coil, the electrical information including one or more of a current of the AC wireless signals, a voltage of the AC wireless signals, a power level of the AC wireless signals, or combinations thereof. The system further includes a demodulation circuit configured to (i) receive the electrical information from the at least one sensor at the source coil, (ii) detect a change in the electrical information, (iii) determine if the change in the electrical information meets or exceeds one of a rise threshold or a fall threshold, (iv) if the change exceeds one of the rise threshold or the fall threshold, generate an alert, (v) and output a plurality of data alerts. The system further includes a transmitter controller configured to (i) receive the plurality of data alerts from the demodulation circuit, and (ii) decode the plurality of data alerts into the wireless data signals.

In a refinement, the at least one other system encodes the wireless data signals as high threshold and low threshold voltages of the AC wireless signals.

In a further refinement, the rise threshold is associated with the high threshold voltage and the fall threshold is associated with the low threshold voltage.

In another further refinement, the wireless data signals are encoded as pulse width encoded wireless data signals.

In a refinement, the wireless data signals are encoded as pulse width encoded wireless data signals and the demodulation circuit includes a slope detector circuit configured to determine a voltage rate of change for the voltage of the wireless power signals.

In a further refinement, the demodulation circuit includes a comparator circuit configured to (i) receive the voltage rate of change, (ii) compare the voltage rate of change to a rising rate of change, (iii) determine that the change in the electrical characteristics meets or exceeds the rise threshold, if the voltage rate of change meets or exceeds the rising rate of change, (iv) compare the voltage rate of change to a falling rate of change, and (v) determine that the change in the electrical characteristics meets or exceeds the fall threshold, if the voltage rate of change meets or exceeds the falling rate of change.

In yet a further refinement, the demodulation circuit includes a set/reset (SR) latch in operative communication with the comparator circuit.

In a refinement, the transmission antenna is configured to operate based on an operating frequency of about 6.78 MHz.

In accordance with yet another aspect of the disclosure, a wireless transmission system is disclosed. The system includes a transmitter antenna configured to couple with at least one other antenna of at least one other system and transmit alternating current (AC) wireless signals to the at least one other antenna, the AC wireless signals including wireless power signals and wireless data signals, the wireless data signals generated by altering electrical characteristics of the AC wireless signals at the at least one other system, the transmitter antenna including a source coil and an internal repeater coil. The system further includes at least one sensor configured to detect electrical information associated with the electrical characteristics of the AC wireless signals, the electrical information including one or more of a current of the AC wireless signals, a voltage of the AC wireless signals and a power level of the AC wireless signals. The system further includes a demodulation circuit configured to (i) receive the electrical information from the at least one sensor, (ii) apply automatic bias control and gain control to the electrical information to generate a modified electrical information signal (iii) detect a change in the modified electrical information signal, (iv) determine if the change in the modified electrical information signal meets or exceeds one of a rise threshold or a fall threshold, (v) if the change exceeds one of the rise threshold or the fall threshold, generate an alert, (vi) and output a plurality of data alerts. The system further includes a transmitter controller configured to (i) receive the plurality of data alerts from the demodulation circuit, and (ii) decode the plurality of data alerts into the wireless data signals.

In a refinement, the at least one sensor is configured to detect the electrical information at the source coil of the transmitter antenna.

In a refinement, the at least one sensor is configured to detect the electrical information at the internal repeater coil of the transmitter antenna.

In a refinement, the transmission antenna is configured to operate based on an operating frequency of about 6.78 MHz.

These and other aspects and features of the present disclosure will be better understood when read in conjunction with the accompanying drawings.

While the present disclosure is directed to a system that can eliminate certain shortcomings noted in or apparent from this Background section, it should be appreciated that such a benefit is neither a limitation on the scope of the disclosed principles n or of the attached claims, except to the extent expressly noted in the claims. Additionally, the discussion of technology in this Background section is reflective of the inventors' own observations, considerations, and thoughts, and is in no way intended to accurately catalog or comprehensively summarize the art currently in the public domain. As such, the inventors expressly disclaim this section as admitted or assumed prior art. Moreover, the identification herein of a desirable course of action reflects the inventors' own observations and ideas, and should not be assumed to indicate an art-recognized desirability.

BRIEF DESCRIPTION OF THE DRAWINGS

FIG. 11B is a top view of another wireless power transmission antenna having a source coil and an internal repeater coil, in accordance with FIGS. 1-9, 11, and the present disclosure.

While the following detailed description will be given with respect to certain illustrative embodiments, it should be understood that the drawings are not necessarily to scale and the disclosed embodiments are sometimes illustrated diagrammatically and in partial views. In addition, in certain instances, details which are not necessary for an understanding of the disclosed subject matter or which render other details too difficult to perceive may have been omitted. It should therefore be understood that this disclosure is not limited to the particular embodiments disclosed and illustrated herein, but rather to a fair reading of the entire disclosure and claims, as well as any equivalents thereto. Additional, different, or fewer components and methods may be included in the systems and methods.

DETAILED DESCRIPTION

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Figure 1:
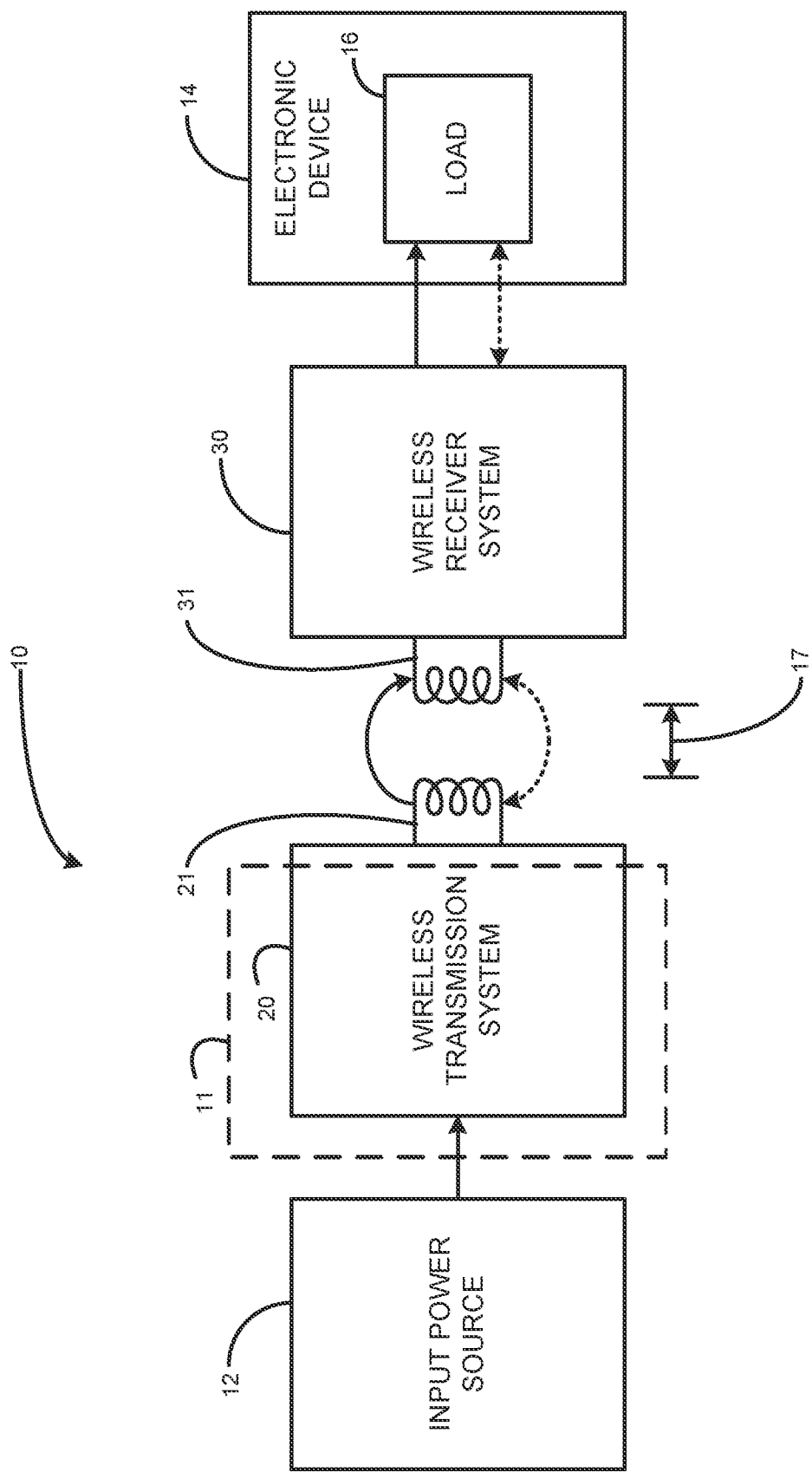
FIG. 1 is a block diagram of an embodiment of a system for wirelessly transferring one or more of electrical energy, electrical power signals, electrical power, electromagnetic energy, electronic data, and combinations thereof, in accordance with the present disclosure.

Referring now to the drawings and with specific reference to FIG. 1, a wireless power transfer system 10 is illustrated. The wireless power transfer system 10 provides for the wireless transmission of electrical signals, such as, but not limited to, electrical energy, electrical power, electrical power signals, electromagnetic energy, and electronically transmittable data ("electronic data"). As used herein, the term "electrical power signal" refers to an electrical signal transmitted specifically to provide meaningful electrical energy for charging and/or directly powering a load, whereas the term "electronic data signal" refers to an electrical signal that is utilized to convey data across a medium.

The wireless power transfer system 10 provides for the wireless transmission of electrical signals via near field magnetic coupling. As shown in the embodiment of FIG. 1, the wireless power transfer system 10 includes one or more wireless transmission systems 20 and one or more wireless receiver systems 30. A wireless receiver system 30 is configured to receive electrical signals from, at least, a wireless transmission system 20.

As illustrated, the wireless transmission system(s) 20 and wireless receiver system(s) 30 may be configured to transmit electrical signals across, at least, a separation distance or gap 17. A separation distance or gap, such as the gap 17, in the context of a wireless power transfer system, such as the system 10, does not include a physical connection, such as a wired connection. There may be intermediary objects located in a separation distance or gap, such as, but not limited to, air, a counter top, a casing for an electronic device, a plastic filament, an insulator, a mechanical wall, among other things; however, there is no physical, electrical connection at such a separation distance or gap.

Thus, the combination of two or more wireless transmission systems 20 and wireless receiver system 30 create an electrical connection without the need for a physical connection. As used herein, the term "electrical connection" refers to any facilitation of a transfer of an electrical current, voltage, and/or power from a first location, device, component, and/or source to a second location, device, component, and/or destination. An "electrical connection" may be a physical connection, such as, but not limited to, a wire, a trace, a via, among other physical electrical connections, connecting a first location, device, component, and/or source to a second location, device, component, and/or destination. Additionally or alternatively, an "electrical connection" may be a wireless power and/or data transfer, such as, but not limited to, magnetic, electromagnetic, resonant, and/or inductive field, among other wireless power and/or data transfers, connecting a first location, device, component, and/or source to a second location, device, component, and/or destination.

Figure 2:
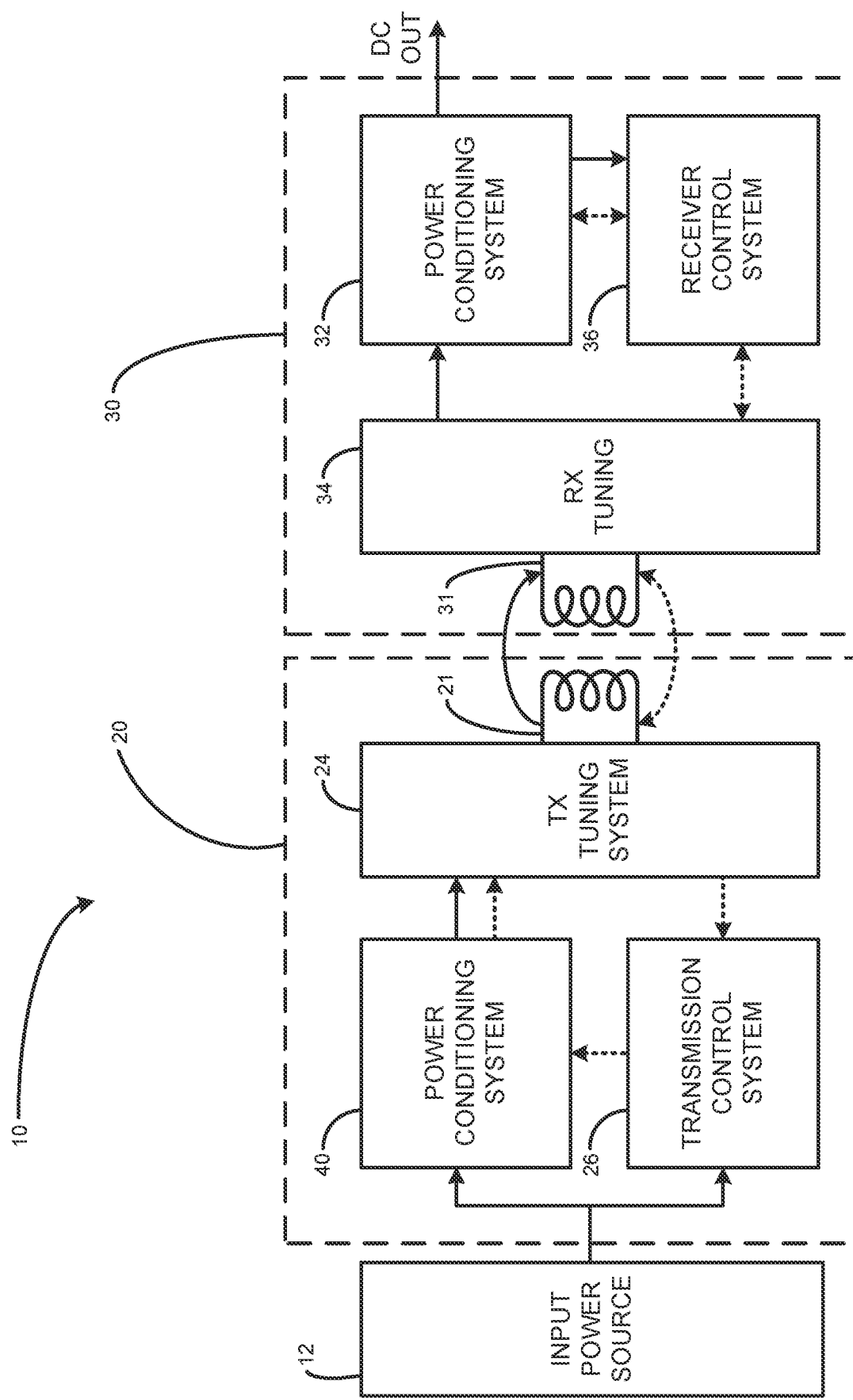
FIG. 2 is a block diagram illustrating components of a wireless transmission system of FIG. 1 and a wireless receiver system of FIG. 1, in accordance with FIG. 1 and the present disclosure.

Further, while FIGS. 1-2 may depict wireless power signals and wireless data signals transferring only from one antenna (e.g., a transmission antenna 21) to another antenna (e.g., a receiver antenna 31 and/or a transmission antenna 21), it is certainly possible that a transmitting antenna 21 may transfer electrical signals and/or couple with one or more other antennas and transfer, at least in part, components of the output signals or magnetic fields of the transmitting antenna 21. Such transmission may include secondary and/or stray coupling or signal transfer to multiple antennas of the system 10.

In some cases, the gap 17 may also be referenced as a "Z-Distance," because, if one considers antennas 21, 31 each to be disposed substantially along respective common X-Y planes, then the distance separating the antennas 21, 31 is the gap in a "Z" or "depth" direction. However, flexible and/or non-planar coils are certainly contemplated by embodiments of the present disclosure and, thus, it is contemplated that the gap 17 may not be uniform, across an envelope of connection distances between the antennas 21, 31. It is contemplated that various tunings, configurations, and/or other parameters may alter the possible maximum distance of the gap 17, such that electrical transmission from the wireless transmission system 20 to the wireless receiver system 30 remains possible. Moreover, in an embodiment, the characteristics of the gap 17 can change during use, such as by an increase or decrease in distance and/or a change in relative device orientations.

The wireless power transfer system 10 operates when the wireless transmission system 20 and the wireless receiver system 30 are coupled. As used herein, the terms "couples," "coupled," and "coupling" generally refer to magnetic field coupling, which occurs when a transmitter and/or any components thereof and a receiver and/or any components thereof are coupled to each other through a magnetic field. Such coupling may include coupling, represented by a coupling coefficient (k), that is at least sufficient for an induced electrical power signal, from a transmitter, to be harnessed by a receiver. Coupling of the wireless transmission system 20 and the wireless receiver system 30, in the system 10, may be represented by a resonant coupling coefficient of the system 10 and, for the purposes of wireless power transfer, the coupling coefficient for the system 10 may be in the range of about 0.01 and 0.9.

As illustrated, at least one wireless transmission system 20 is associated with an input power source 12. The input power source 12 may be operatively associated with a host device, which may be any electrically operated device, circuit board, electronic assembly, dedicated charging device, or any other contemplated electronic device. Example host devices, with which the wireless transmission system 20 may be associated therewith, include, but are not limited to including, a device that includes an integrated circuit, a portable computing device, storage medium for electronic devices, charging apparatus for one or multiple electronic devices, dedicated electrical charging devices, among other contemplated electronic devices.

The input power source 12 may be or may include one or more electrical storage devices, such as an electrochemical cell, a battery pack, and/or a capacitor, among other storage devices. Additionally or alternatively, the input power source 12 may be any electrical input source (e.g., any alternating current (AC) or direct current (DC) delivery port) and may include connection apparatus from said electrical input source to the wireless transmission system 20 (e.g., transformers, regulators, conductive conduits, traces, wires, or equipment, goods, computer, camera, mobile phone, and/or other electrical device connection ports and/or adaptors, such as but not limited to USB ports and/or adaptors, among other contemplated electrical components).

Electrical energy received by the wireless transmission system(s) 20 is then used for at least two purposes: to provide electrical power to internal components of the wireless transmission system 20 and to provide electrical power to the transmission antenna 21. The transmission antenna 21 is configured to wirelessly transmit the electrical signals conditioned and modified for wireless transmission by the wireless transmission system 20 via near-field magnetic coupling (NFMC). Near-field magnetic coupling enables the transfer of signals wirelessly through magnetic induction between the transmission antenna 21 and one or more of receiving antenna 31 of, or associated with, the wireless receiver system 30, another transmission antenna 21, or combinations thereof. Near-field magnetic coupling may be and/or be referred to as "inductive coupling," which, as used herein, is a wireless power transmission technique that utilizes an alternating electromagnetic field to transfer electrical energy between two antennas. Such inductive coupling is the near field wireless transmission of magnetic energy between two magnetically coupled coils that are tuned to resonate at a similar frequency. Accordingly, such near-field magnetic coupling may enable efficient wireless power transmission via resonant transmission of confined magnetic fields. Further, such near-field magnetic coupling may provide connection via "mutual inductance," which, as defined herein is the production of an electromotive force in a circuit by a change in current in a second circuit magnetically coupled to the first.

In one or more embodiments, the inductor coils of either the transmission antenna 21 or the receiver antenna 31 are strategically positioned to facilitate reception and/or transmission of wirelessly transferred electrical signals through near field magnetic induction. Antenna operating frequencies may comprise relatively high operating frequency ranges, examples of which may include, but are not limited to, 6.78 MHz (e.g., in accordance with the Rezence and/or Airfuel interface standard and/or any other proprietary interface standard operating at a frequency of 6.78 MHz), 13.56 MHz (e.g., in accordance with the NFC standard, defined by ISO/IEC standard 18092), 27 MHz, and/or an operating frequency of another proprietary operating mode. The operating frequencies of the antennas 21, 31 may be operating frequencies designated by the International Telecommunications Union (ITU) in the Industrial, Scientific, and Medical (ISM) frequency bands, including not limited to 6.78 MHz, 13.56 MHz, and 27 MHz, which are designated for use in wireless power transfer.

The transmitting antenna and the receiving antenna of the present disclosure may be configured to transmit and/or receive electrical power having a magnitude that ranges from about 10 milliwatts (mW) to about 500 watts (W). In one or more embodiments the inductor coil of the transmitting antenna 21 is configured to resonate at a transmitting antenna resonant frequency or within a transmitting antenna resonant frequency band. A "coil" of a wireless power antenna (e.g., the transmission antenna 21, the receiver antenna 31), as defined herein, is any conductor, wire, or other current carrying material, configured to resonate for the purposes of wireless power transfer and optional wireless data transfer.

As known to those skilled in the art, a "resonant frequency" or "resonant frequency band" refers a frequency or frequencies wherein amplitude response of the antenna is at a relative maximum, or, additionally or alternatively, the frequency or frequency band where the capacitive reactance has a magnitude substantially similar to the magnitude of the inductive reactance. In one or more embodiments, the transmitting antenna resonant frequency is at a high frequency, as known to those in the art of wireless power transfer.

The wireless receiver system 30 may be associated with at least one electronic device 14, wherein the electronic device 14 may be any device that requires electrical power for any function and/or for power storage (e.g., via a battery and/or capacitor). Additionally, the electronic device 14 may be any device capable of receipt of electronically transmissible data. For example, the device may be, but is not limited to being, a handheld computing device, a mobile device, a portable appliance, a computer peripheral, an integrated circuit, an identifiable tag, a kitchen utility device, an electronic tool, an electric vehicle, a game console, a robotic device, a wearable electronic device (e.g., an electronic watch, electronically modified glasses, altered-reality (AR) glasses, virtual reality (VR) glasses, among other things), a portable scanning device, a portable identifying device, a sporting good, an embedded sensor, an Internet of Things (IoT) sensor, IoT enabled clothing, IoT enabled recreational equipment, industrial equipment, medical equipment, a medical device a tablet computing device, a portable control device, a remote controller for an electronic device, a gaming controller, among other things.

For the purposes of illustrating the features and characteristics of the disclosed embodiments of FIGS. 1-10, arrow-ended lines are utilized to illustrate transferrable and/or communicative signals and various patterns are used to illustrate electrical signals that are intended for power transmission and electrical signals that are intended for the transmission of data and/or control instructions. Solid lines indicate signal transmission of electrical energy over a physical and/or wireless power transfer, in the form of power signals that are, ultimately, utilized in wireless power transmission from the wireless transmission system 20 to the wireless receiver system 30. Further, dotted lines are utilized to illustrate electronically transmittable data signals, which ultimately may be wirelessly transmitted from the wireless transmission system 20 to the wireless receiver system 30.

While the systems and methods herein illustrate the transmission of wirelessly transmitted energy, wireless power signals, wirelessly transmitted power, wirelessly transmitted electromagnetic energy, and/or electronically transmittable data, it is certainly contemplated that the systems, methods, and apparatus disclosed herein may be utilized in the transmission of only one signal, various combinations of two signals, or more than two signals and, further, it is contemplated that the systems, method, and apparatus disclosed herein may be utilized for wireless transmission of other electrical signals in addition to or uniquely in combination with one or more of the above mentioned signals. In some examples, the signal paths of solid or dotted lines may represent a functional signal path, whereas, in practical application, the actual signal is routed through additional components en route to its indicated destination. For example, it may be indicated that a data signal routes from a communications apparatus to another communications apparatus; however, in practical application, the data signal may be routed through an amplifier, then through a transmission antenna, to a receiver antenna, where, on the receiver end, the data signal is decoded by a respective communications device of the receiver.

Figure 3:
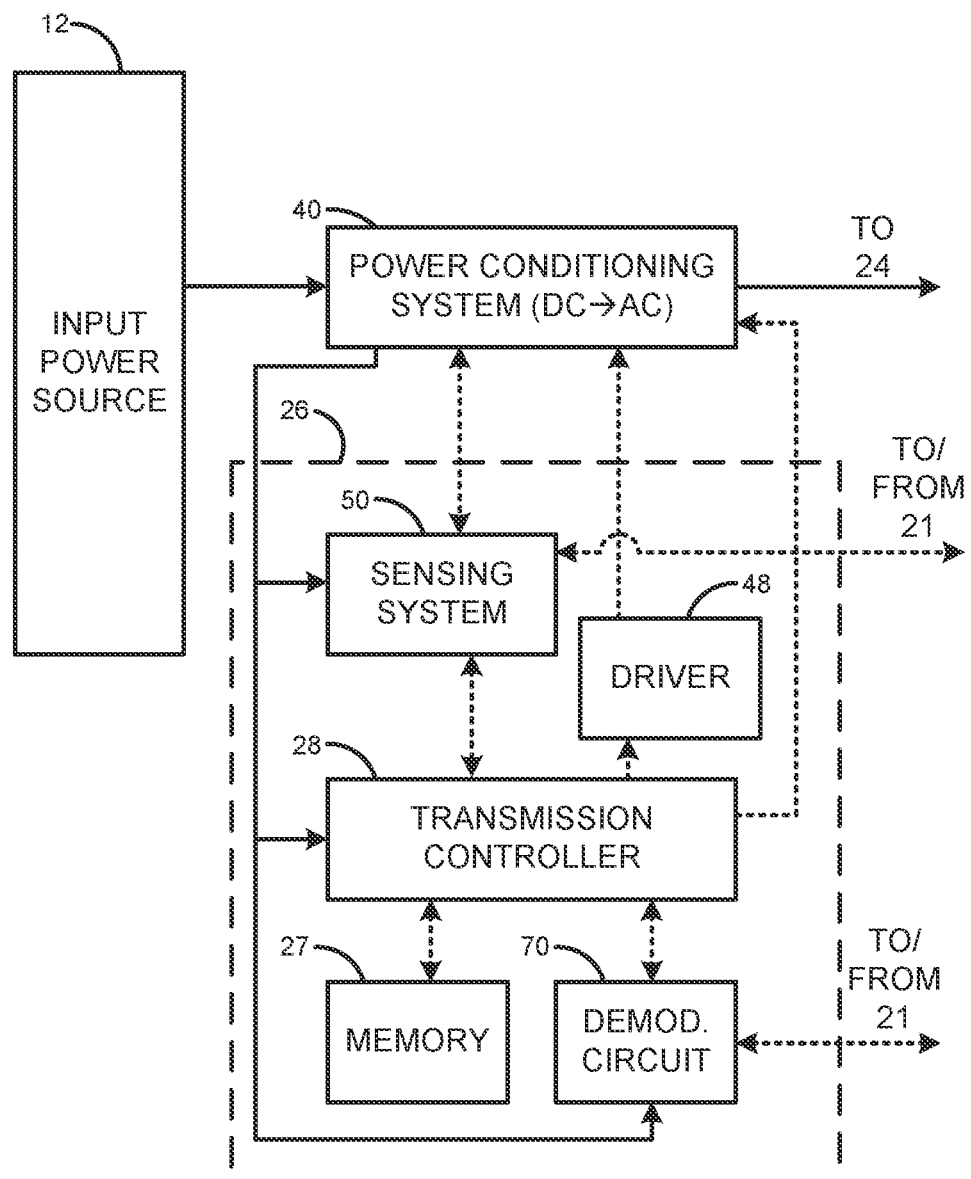
FIG. 3 is a block diagram illustrating components of a transmission control system of the wireless transmission system of FIG. 2, in accordance with FIG. 1, FIG. 2, and the present disclosure.

Turning now to FIGS. 2-3, the wireless power transfer system 10 is illustrated as a block diagram including example sub-systems of both the wireless transmission systems 20 and the wireless receiver systems 30. The wireless transmission systems 20 may include, at least, a power conditioning system 40, a transmission control system 26, a demodulation circuit 70, a transmission tuning system 24, and the transmission antenna 21. A first portion of the electrical energy input from the input power source 12 may be configured to electrically power components of the wireless transmission system 20 such as, but not limited to, the transmission control system 26.

A second portion of the electrical energy input from the input power source 12 is conditioned and/or modified for wireless power transmission, to the wireless receiver system 30, via the transmission antenna 21. Accordingly, the second portion of the input energy is modified and/or conditioned by the power conditioning system 40. While not illustrated, it is certainly contemplated that one or both of the first and second portions of the input electrical energy may be modified, conditioned, altered, and/or otherwise changed prior to receipt by the power conditioning system 40 and/or transmission control system 26, by further contemplated subsystems (e.g., a voltage regulator, a current regulator, switching systems, fault systems, safety regulators, among other things).

Referring more specifically now to FIG. 3, with continued reference to FIGS. 1 and 2, subcomponents and/or systems of the transmission control system 26 are illustrated. The transmission control system 26 may include a sensing system 50, a transmission controller 28, a driver 48, a memory 27 and a demodulation circuit 70.

The transmission controller 28 may be any electronic controller or computing system that includes, at least, a processor which performs operations, executes control algorithms, stores data, retrieves data, gathers data, controls and/or provides communication with other components and/or subsystems associated with the wireless transmission system 20, and/or performs any other computing or controlling task desired. The transmission controller 28 may be a single controller or may include more than one controller disposed to control various functions and/or features of the wireless transmission system 20. Functionality of the transmission controller 28 may be implemented in hardware and/or software and may rely on one or more data maps relating to the operation of the wireless transmission system 20. To that end, the transmission controller 28 may be operatively associated with the memory 27.

The memory may include one or more of internal memory, external memory, and/or remote memory (e.g., a database and/or server operatively connected to the transmission controller 28 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory machine readable and/or computer readable memory media.

While particular elements of the transmission control system 26 are illustrated as independent components and/or circuits (e.g., the driver 48, the memory 27, the sensing system 50, among other contemplated elements) of the transmission control system 26, such components may be integrated with the transmission controller 28. In some examples, the transmission controller 28 may be an integrated circuit configured to include functional elements of one or both of the transmission controller 28 and the wireless transmission system 20, generally.

As illustrated, the transmission controller 28 is in operative association, for the purposes of data transmission, receipt, and/or communication, with, at least, the memory 27, the power conditioning system 40, the driver 48, and the sensing system 50. The driver 48 may be implemented to control, at least in part, the operation of the power conditioning system 40. In some examples, the driver 48 may receive instructions from the transmission controller 28 to generate and/or output a generated pulse width modulation (PWM) signal to the power conditioning system 40. In some such examples, the PWM signal may be configured to drive the power conditioning system 40 to output electrical power as an alternating current signal, having an operating frequency defined by the PWM signal. In some examples, PWM signal may be configured to generate a duty cycle for the AC power signal output by the power conditioning system 40. In some such examples, the duty cycle may be configured to be about 50% of a given period of the AC power signal.

The sensing system may include one or more sensors, wherein each sensor may be operatively associated with one or more components of the wireless transmission system 20 and configured to provide information and/or data. The term "sensor" is used in its broadest interpretation to define one or more components operatively associated with the wireless transmission system 20 that operate to sense functions, conditions, electrical characteristics, operations, and/or operating characteristics of one or more of the wireless transmission system 20, the wireless receiving system 30, the input power source 12, the host device 11, the transmission antenna 21, the receiver antenna 31, along with any other components and/or subcomponents thereof.

Figure 4:
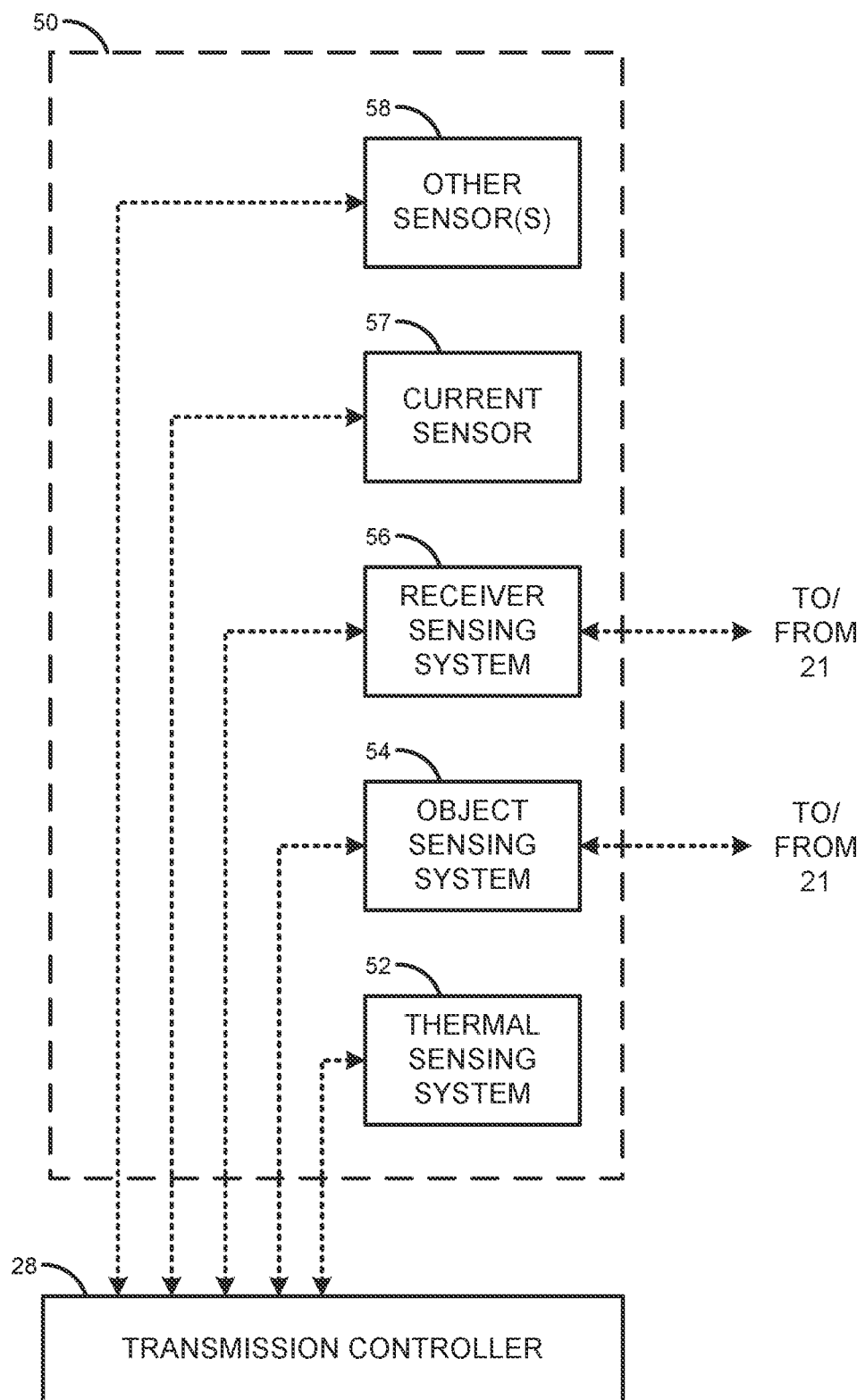
FIG. 4 is a block diagram illustrating components of a sensing system of the transmission control system of FIG. 3, in accordance with FIGS. 1-3 and the present disclosure.
Figure 5:
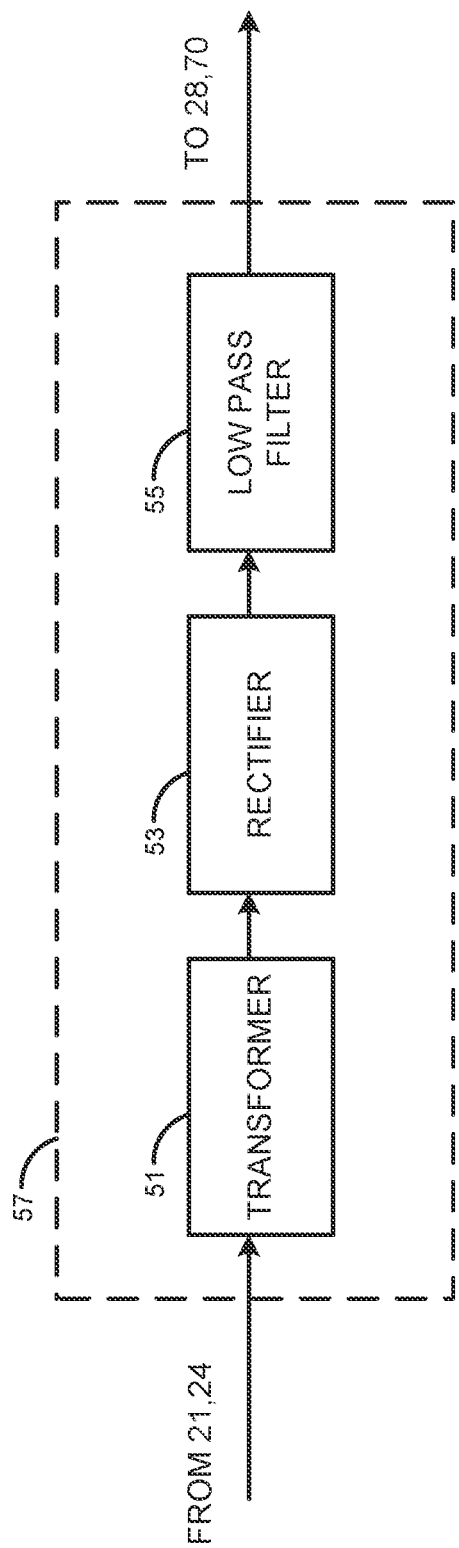
FIG. 5 is a block diagram of an example low pass filter of the sensing system of FIG. 4, in accordance with FIGS. 1-4 and the present disclosure.

As illustrated in the embodiment of FIG. 4, the sensing system 50 may include, but is not limited to including, a thermal sensing system 52, an object sensing system 54, a receiver sensing system 56, a current sensor 57, and/or any other sensor(s) 58. Within these systems, there may exist even more specific optional additional or alternative sensing systems addressing particular sensing aspects required by an application, such as, but not limited to: a condition-based maintenance sensing system, a performance optimization sensing system, a state-of-charge sensing system, a temperature management sensing system, a component heating sensing system, an IoT sensing system, an energy and/or power management sensing system, an impact detection sensing system, an electrical status sensing system, a speed detection sensing system, a device health sensing system, among others. The object sensing system 54, may be a foreign object detection (FOD) system.

Each of the thermal sensing system 52, the object sensing system 54, the receiver sensing system 56, the current sensor 57 and/or the other sensor(s) 58, including the optional additional or alternative systems, are operatively and/or communicatively connected to the transmission controller 28. The thermal sensing system 52 is configured to monitor ambient and/or component temperatures within the wireless transmission system 20 or other elements nearby the wireless transmission system 20. The thermal sensing system 52 may be configured to detect a temperature within the wireless transmission system 20 and, if the detected temperature exceeds a threshold temperature, the transmission controller 28 prevents the wireless transmission system 20 from operating. Such a threshold temperature may be configured for safety considerations, operational considerations, efficiency considerations, and/or any combinations thereof. In a non-limiting example, if, via input from the thermal sensing system 52, the transmission controller 28 determines that the temperature within the wireless transmission system 20 has increased from an acceptable operating temperature to an undesired operating temperature (e.g., in a non-limiting example, the internal temperature increasing from about 20° Celsius (C) to about 50° C., the transmission controller 28 prevents the operation of the wireless transmission system 20 and/or reduces levels of power output from the wireless transmission system 20. In some non-limiting examples, the thermal sensing system 52 may include one or more of a thermocouple, a thermistor, a negative temperature coefficient (NTC) resistor, a resistance temperature detector (RTD), and/or any combinations thereof.

As depicted in FIG. 4, the transmission sensing system 50 may include the object sensing system 54. The object sensing system 54 may be configured to detect one or more of the wireless receiver system 30 and/or the receiver antenna 31, thus indicating to the transmission controller 28 that the receiver system 30 is proximate to the wireless transmission system 20. Additionally or alternatively, the object sensing system 54 may be configured to detect presence of unwanted objects in contact with or proximate to the wireless transmission system 20. In some examples, the object sensing system 54 is configured to detect the presence of an undesired object. In some such examples, if the transmission controller 28, via information provided by the object sensing system 54, detects the presence of an undesired object, then the transmission controller 28 prevents or otherwise modifies operation of the wireless transmission system 20. In some examples, the object sensing system 54 utilizes an impedance change detection scheme, in which the transmission controller 28 analyzes a change in electrical impedance observed by the transmission antenna 20 against a known, acceptable electrical impedance value or range of electrical impedance values.

Additionally or alternatively, the object sensing system 54 may utilize a quality factor (Q) change detection scheme, in which the transmission controller 28 analyzes a change from a known quality factor value or range of quality factor values of the object being detected, such as the receiver antenna 31. The "quality factor" or "Q" of an inductor can be defined as (frequency (Hz)×inductance (H))/resistance (ohms), where frequency is the operational frequency of the circuit, inductance is the inductance output of the inductor and resistance is the combination of the radiative and reactive resistances that are internal to the inductor. "Quality factor," as defined herein, is generally accepted as an index (figure of measure) that measures the efficiency of an apparatus like an antenna, a circuit, or a resonator. In some examples, the object sensing system 54 may include one or more of an optical sensor, an electro-optical sensor, a Hall Effect sensor, a proximity sensor, and/or any combinations thereof. In some examples, the quality factor measurements, described above, may be performed when the wireless power transfer system 10 is performing in band communications.

The receiver sensing system 56 is any sensor, circuit, and/or combinations thereof configured to detect a presence of any wireless receiving system that may be couplable with the wireless transmission system 20. In some examples, the receiver sensing system 56 and the object sensing system 54 may be combined, may share components, and/or may be embodied by one or more common components. In some examples, if the presence of any such wireless receiving system is detected, wireless transmission of electrical energy, electrical power, electromagnetic energy, and/or data by the wireless transmission system 20 to said wireless receiving system is enabled. In some examples, if the presence of a wireless receiver system is not detected, continued wireless transmission of electrical energy, electrical power, electromagnetic energy, and/or data is prevented from occurring. Accordingly, the receiver sensing system 56 may include one or more sensors and/or may be operatively associated with one or more sensors that are configured to analyze electrical characteristics within an environment of or proximate to the wireless transmission system 20 and, based on the electrical characteristics, determine presence of a wireless receiver system 30.

The current sensor 57 may be any sensor configured to determine electrical information from an electrical signal, such as a voltage or a current, based on a current reading at the current sensor 57. Components of an example current sensor 57 are further illustrated in FIG. 5, which is a block diagram for the current sensor 57. The current sensor 57 may include a transformer 51, a rectifier 53, and/or a low pass filter 55, to process the AC wireless signals, transferred via coupling between the wireless receiver system(s) 20 and wireless transmission system(s) 30, to determine or provide information to derive a current ($I_{Tx}$) or voltage ($V_{Tx}$) at the transmission antenna 21. The transformer 51 may receive the AC wireless signals and either step up or step down the voltage of the AC wireless signal, such that it can properly be processed by the current sensor. The rectifier 53 may receive the transformed AC wireless signal and rectify the signal, such that any negative voltages remaining in the transformed AC wireless signal are either eliminated or converted to opposite positive voltages, to generate a rectified AC wireless signal. The low pass filter 55 is configured to receive the rectified AC wireless signal and filter out AC components (e.g., the operating or carrier frequency of the AC wireless signal) of the rectified AC wireless signal, such that a DC voltage is output for the current ($I_{Tx}$) and/or voltage ($V_{Tx}$) at the transmission antenna 21.

Figure 6:
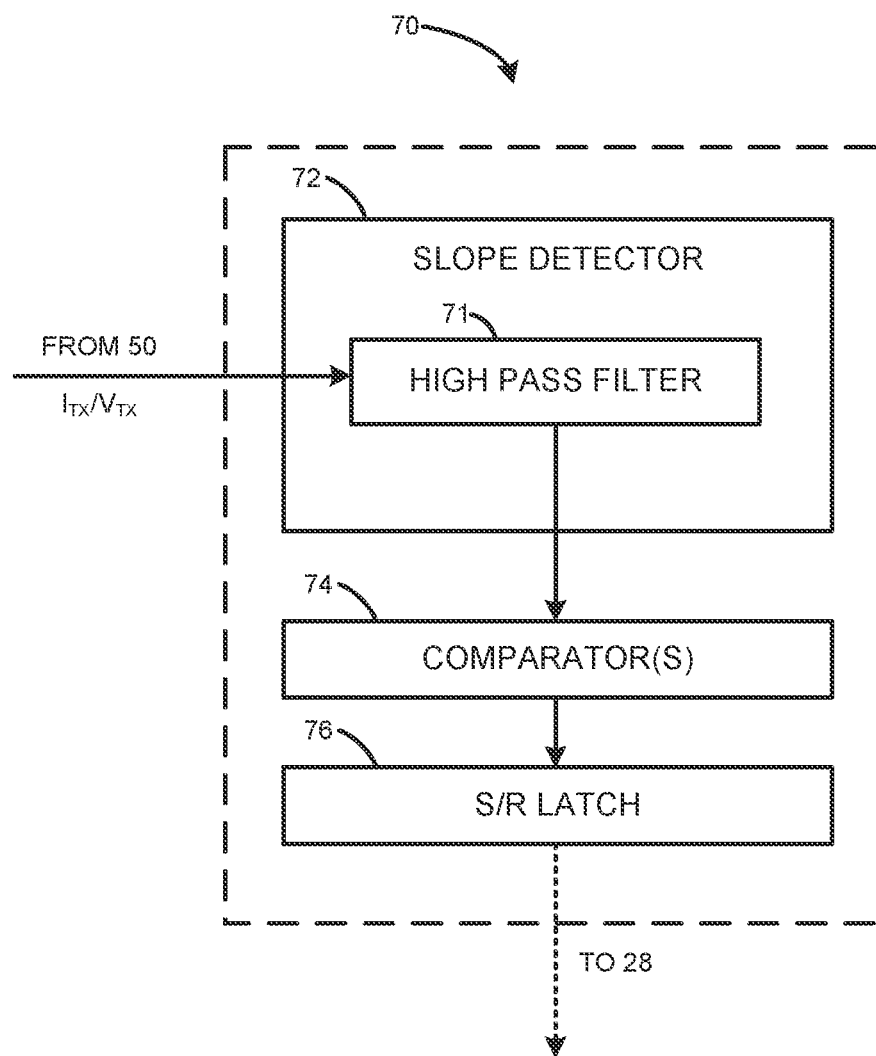
FIG. 6 is a block diagram illustrating components of a demodulation circuit for the wireless transmission system of FIGS. 2, in accordance with FIGS. 1-5 and the present disclosure.

FIG. 6 is a block diagram for a demodulation circuit 70 for the wireless transmission system(s) 20, which is used by the wireless transmission system 20 to simplify or decode components of wireless data signals of an alternating current (AC) wireless signal, prior to transmission of the wireless data signal to the transmission controller 28. The demodulation circuit includes, at least, a slope detector 72 and a comparator 74. In some examples, the demodulation circuit 70 includes a set/reset (SR) latch 76.

In some examples, the demodulation circuit 70 may be an analog circuit comprised of one or more passive components (e.g., resistors, capacitors, inductors, diodes, among other passive components) and/or one or more active components (e.g., operational amplifiers, logic gates, among other active components). Alternatively, it is contemplated that the demodulation circuit 70 and some or all of its components may be implemented as an integrated circuit (IC). In either an analog circuit or IC, it is contemplated that the demodulation circuit may be external of the transmission controller 28 and is configured to provide information associated with wireless data signals transmitted from the wireless receiver system 30 to the wireless transmission system 20.

The demodulation circuit 70 is configured to receive electrical information (e.g., $I_{Tx}$, $V_{Tx}$ from at least one sensor (e.g., a sensor of the sensing system 50), detect a change in such electrical information, determine if the change in the electrical information meets or exceeds one of a rise threshold or a fall threshold. If the change exceeds one of the rise threshold or the fall threshold, the demodulation circuit 70 generates an output signal and also generates and outputs one or more data alerts. Such data alerts are received by the transmitter controller 28 and decoded by the transmitter controller 28 to determine the wireless data signals.

In other words, in an embodiment, the demodulation circuit 70 is configured to monitor the slope of an electrical signal (e.g., slope of a voltage signal at the power conditioning system 32 of a wireless receiver system 30) and to output an indication when said slope exceeds a maximum slope threshold or undershoots a minimum slope threshold. Such slope monitoring and/or slope detection by the communications system 70 is particularly useful when detecting or decoding an amplitude shift keying (ASK) signal that encodes the wireless data signals in-band of the wireless power signal (which is oscillating at the operating frequency).

In an ASK signal, as noted above, the wireless data signals are encoded by damping the voltage of the magnetic field between the wireless transmission system 20 and the wireless receiver system 30. Such damping and subsequent re-rising of the voltage in the field is performed based on an underlying encoding scheme for the wireless data signals (e.g., binary coding, Manchester coding, pulse-width modulated coding, among other known or novel coding systems and methods). The receiver of the wireless data signals (e.g., the wireless transmission system 20 in this example) can then detect rising and falling edges of the voltage of the field and decode said rising and falling edges to demodulate the wireless data signals.

Ideally, an ASK signal would rise and fall instantaneously, with no discernable slope between the high voltage and the low voltage for ASK modulation; however, in reality, there is a finite amount of time that passes when the ASK signal transitions from the "high" voltage to the "low" voltage and vice versa. Thus, the voltage or current signal to be sensed by the demodulation circuit 70 will have some slope or rate of change in voltage when transitioning. By configuring the demodulation circuit 70 to determine when said slope meets, overshoots and/or undershoots such rise and fall thresholds, established based on the known maximum/minimum slope of the carrier signal at the operating frequency, the demodulation circuit can accurately detect rising and falling edges of the ASK signal.

Thus, a relatively inexpensive and/or simplified circuit may be utilized to at least partially decode ASK signals down to notifications or alerts for rising and falling slope instances. As long as the transmission controller 28 is programmed to understand the coding schema of the ASK modulation, the transmission controller 28 will expend far less computational resources than would have been needed to decode the leading and falling edges directly from an input current or voltage sense signal from the sensing system 50. To that end, as the computational resources required by the transmission controller 28 to decode the wireless data signals are significantly decreased due to the inclusion of the demodulation circuit 70, the demodulation circuit 70 may significantly reduce BOM of the wireless transmission system 20, by allowing usage of cheaper, less computationally capable processor(s) for or with the transmission controller 28.

The demodulation circuit 70 may be particularly useful in reducing the computational burden for decoding data signals, at the transmitter controller 28, when the ASK wireless data signals are encoded/decoded utilizing a pulse-width encoded ASK signals, in-band of the wireless power signals. A pulse-width encoded ASK signal is a signal wherein the data is encoded as a percentage of a period of a signal. For example, a two-bit pulse width encoded signal may encode a start bit as 20% of a period between high edges of the signal, encode "1" as 40% of a period between high edges of the signal, and encode "0" as 60% of a period between high edges of the signal, to generate a binary encoding format in the pulse width encoding scheme.

Thus, as the pulse width encoding relies solely on monitoring rising and falling edges of the ASK signal, the periods between rising times need not be constant and the data signals may be asynchronous or "unclocked." Examples of pulse width encoding and systems and methods to perform such pulse width encoding are explained in greater detail in U.S. patent application Ser. No. 16/735,342 titled "Systems and Methods for Wireless Power Transfer Including Pulse Width Encoded Data Communications," to Michael Katz, which is commonly owned by the owner of the instant application and is hereby incorporated by reference in its entirety, for all that it teaches without exclusion of any part thereof.

As noted above, slope detection, and hence in-band transfer of data, may become ineffective or inefficient when the signal strength varies from the parameters relied upon during design. For example, when the relative positions of the data sender and data receiver vary significantly during use of the system, the electromagnetic coupling between sender and receiver coils or antennas will also vary. Data detection and decoding are optimized for a particular coupling may fail or underperform at other couplings. As such, a high sensitivity non-saturating detection system is needed to allow the system to operate in environments wherein coupling changes dynamically.

Figure 7A:
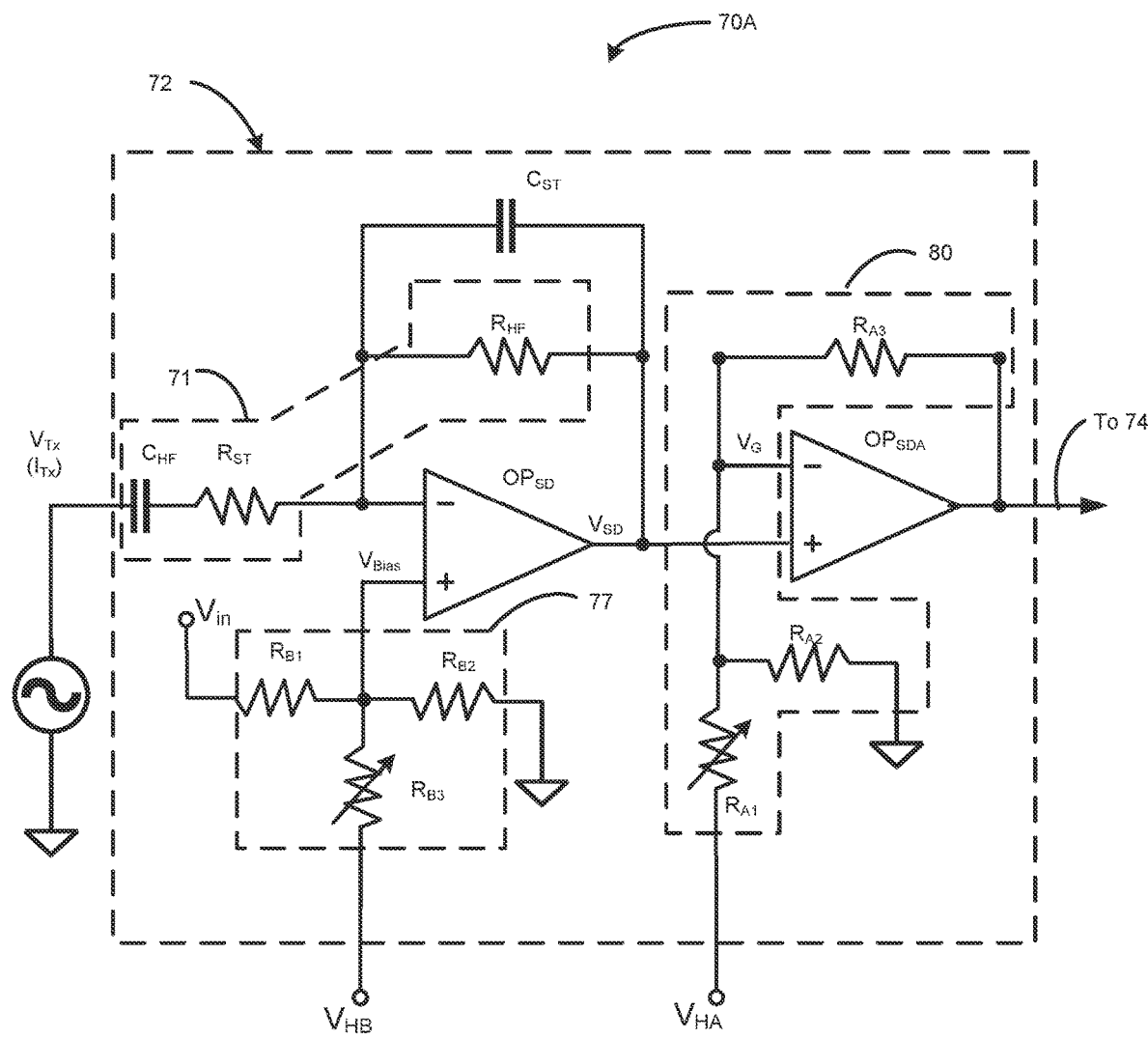
FIG. 7A is a first portion of a schematic circuit diagram for the demodulation circuit of FIG. 6 in accordance with an embodiment of the present disclosure.
Figure 7B:
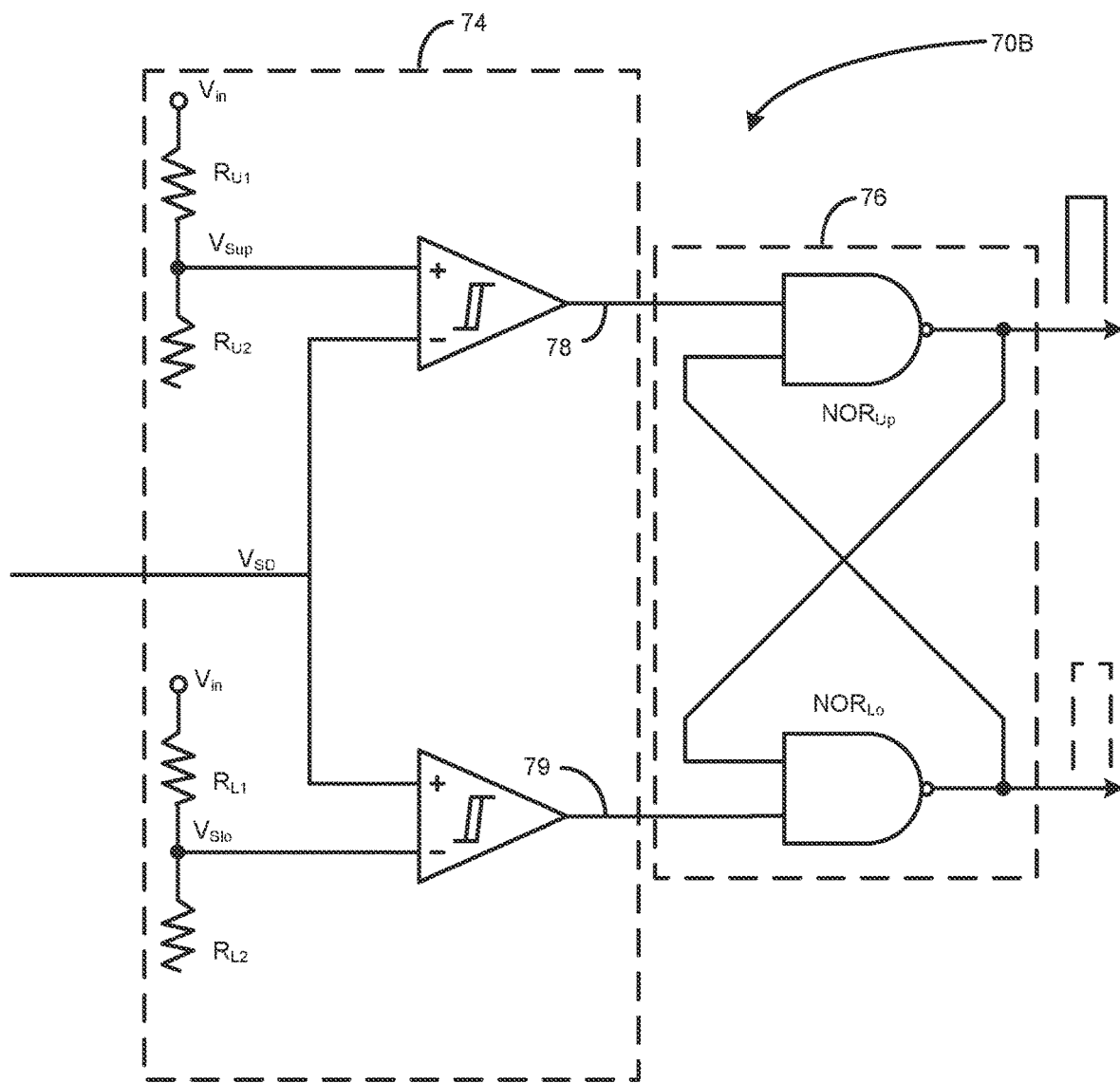
FIG. 7B is a second portion of the schematic circuit diagram for the demodulation circuit of FIGS. 6 and 7A, in accordance with an embodiment of the present disclosure.

For example, referring to FIGS. 7, the signal created by the high pass filter 71 of the slope detector 72, prior to being amplified by $OP_{SD}$, will vary as a result of varying coupling (as will the power signal, but, for the purposes of the discussion of in-band data, it has now been filtered out at this point). Thus, the difference in magnitude of the amplified signals will vary by even more. At the upper end, substantially improved coupling may cause saturation of $OP_{SD}$, at said upper end, if the system is tuned for small signal detection. Similarly, substantially degraded coupling may result in an undetectable signal if the system is tuned for high, good, and/or fair coupling. Moreover, a pre-amp signal with a positive offset may result in clipped (e.g., saturated) positive signals, post-amplification, unless gain is reduced; however, the reduced gain may in turn render negative signals undetectable. Additionally, a varying load at the receiver may affect the signal, necessitating the amplification of the data signal at the slope detector 72.

As such, instability in coupling is generally not well-tolerated by inductive charging systems, since it causes the filtered and amplified signal to vary too greatly. For example, a phone placed into a fitted dock will stay in a specific location relative to the dock, and any coupling therebetween will remain relatively constant. However, a phone placed on a desktop with an inductive charging station under the desktop may not maintain a fixed relative location, nor a fixed relative orientation and, thus, the range of coupling between the transmitter and the receiver of the phone may vary during the charging process. Further, consider a wireless power system configured for directly powering and/or charging a medical device, while the medical device resides within a human body. Due to natural displacement and/or internal movement of organic elements of the human body, the medical device may not maintain constant location, relative to the body and/or an associated charger positioned outside of the body, and, thus, the transmitter and receiver may couple at a wide range of high, good, fair, low, and/or insufficient coupling levels. Further still, consider a computer peripheral being charged by a charging mat on a user's desk. It may be desired to charge said peripheral, such as a mouse or other input device, during use of the device; such use of the peripheral will necessarily alter coupling during use, as it will be moved regularly, with respect to positioning of the transmitting charging mat.

The effect caused by a difference in the coupling coefficient k can be illustrated by a few non-limiting examples. Consider a case wherein k=0.041, representing fairly strong coupling. In this case, the induced voltage delta ($V_{delta}$) may be about 160 mV, with the corresponding amplified signal running between a peak of 3.15V and a nadir of 0.45V, for a swing of about 2.70V around a DC offset of 1.86V (i.e., 1.35V above and below the DC offset value).

Now consider a case in the same system wherein a coupling value of 0.01 is exhibited, representing fairly weak coupling. This weakening could happen due to relative movement, intervening materials, or other circumstance. Now $V_{delta}$ may be about 15 mV, with the corresponding amplified signal running between a peak of 1.94V and a nadir of 1.77V, for a swing of about 140 mV around a DC offset of 1.86V (i.e., about 70 mV above and below the DC offset value).

As can be seen from this example, while the strongly coupled case yields robust signals, the weakly coupled case yields very small signals atop a fairly large offset. While perhaps generally detectable, these signal level present a significant risk of data errors and consequently lowered throughput. Moreover, while there is room for increased amplification, the level of amplification, especially given the DC offset, is constrained by the saturation level of the available economical operational amplifier circuits, which, in some examples may be about 4.0V.

However, in an embodiment, automatic gain control in amplification is combined with a voltage offset in slope detection to allow the system to adapt to varying degrees of coupling. This is especially helpful in situations where the physical locations of the coupled devices are not tightly constrained during coupling.

Continuing with the example of FIG. 7, in the illustrated circuit 72, the bias voltage $V'_{Bias}$ for slope detection is provided by a voltage divider 77 (including linked resistors $R_{B1}$, $R_{B2}$, $R_{B3}$), which provides a voltage between $V_{in}$ and ground based on a control voltage $V_{HB}$. Given the control voltage $V_{HB}$, the bias voltage $V'_{Bias}$ is set by adjusting a resistance in the voltage divider. In this connection, one of the resistors, e.g., $R_{B3}$, may be a variable resistor, such as a digitally adjustable potentiometer, with the specific resistance being generated via an adaptive bias and gain protocol to be described below, e.g., $R_{bias}$.

Similarly, in the illustrated circuit 72, the output voltage $V_{SD}$ provided to the next stage, comparator 74, is first amplified at a level set by a voltage divider 80 (including linked resistors $R_{A1}$, $R_{A2}$, $R_{A3}$), based on the control voltage $V_{HA}$ to generate $V'_{SD}$ (slope detection signal). The amplification of $V_{SD}$ to generate $V'_{SD}$ (amplified slope detection signal) is similarly set via a variable potentiometer in the voltage divider, e.g., $R_{A1}$, being set to a specific value, e.g., $R_{gain}$ generated via an adaptive bias and gain protocol to be described later below.

With respect to the aforementioned, non-limiting example, with automatic gain and bias in slope detection, the circuit is configured to accommodate a $1_{amp\ slope\ delta}$ of between 400 mv and 2.2V, and a $V_{amp\ DC}$ offset of between 1.8V and 2.2V. In order to determine appropriate offsets and gains, the system may employ a beaconing sequence state. The beaconing sequence ensures that the transmitter is generally able to detect the receiver at all possible allowed coupling positions and orientations.

Referring still to FIGS. 7, the slope detector 72 includes a high pass filter 71 and an optional stabilizing circuit 73. The high pass filter 71 is configured to monitor for higher frequency components of the AC wireless signals and may include, at least, a filter capacitor ($C_{HF}$) and a filter resistor ($R_{HF}$). The values for $C_{HF}$ and $R_{HF}$ are selected and/or tuned for a desired cutoff frequency for the high pass filter 71. In some examples, the cutoff frequency for the high pass filter 71 may be selected as a value greater than or equal to about 1-2 kHz, to ensure adequately fast slope detection by the slope detector 72, when the operating frequency of the system 10 is on the order of MHz (e.g., an operating frequency of about 6.78 MHz). In some examples, the high pass filter 71 is configured such that harmonic components of the detected slope are unfiltered. In view of the current sensor 57 of FIG. 5, the high pass filter 71 and the low pass filter 55, in combination, may function as a bandpass filter for the demodulation circuit 70.

$OP_{SD}$ is any operational amplifier having an adequate bandwidth for proper signal response, for outputting the slope of $V_{Tx}$, but low enough to attenuate components of the signal that are based on the operating frequency and/or harmonics of the operating frequency. Additionally or alternatively, $OP_{SD}$ may be selected to have a small input voltage range for $V_{Tx}$, such that $OP_{SD}$ may avoid unnecessary error or clipping during large changes in voltage at $V_{Tx}$. Further, an input bias voltage ($V_{Bias}$) for $OP_{SD}$ may be selected based on values that ensure $OP_{SD}$ will not saturate under boundary conditions (e.g., steepest slopes, largest changes in $V_{Tx}$). It is to be noted, and is illustrated in Plot B of FIG. 8, that when no slope is detected, the output of the slope detector 72 will be $V_{Bias}$.

As the passive components of the slope detector 72 will set the terminals and zeroes for a transfer function of the slope detector 72, such passive components must be selected to ensure stability. To that end, if the desired and/or available components selected for $C_{HF}$ and $R_{HF}$ do not adequately set the terminals and zeros for the transfer function, additional, optional stability capacitor(s) $C_{ST}$ may be placed in parallel with $R_{HF}$ and stability resistor $R_{ST}$ may be placed in the input path to $OP_{SD}$.

Output of the slope detector 72 (Plot B representing $V_{SD}$) may approximate the following equation:

$$V_{SD} = -R_{HF}C_{HF}\frac{dV}{dt} + V_{Bias}$$

Thus, $V_{SD}$ will approximate to $V_{Bias}$, when no change in voltage (slope) is detected, and Output $V_{SD}$ of the slope detector 72 is represented in Plot B. As can be seen, the value of $V_{SD}$ approximates $V_{Bias}$ when no change in voltage (slope) is detected, whereas $V_{SD}$ will output the change in voltage (dV/dt), as scaled by the high pass filter 71, when $V_{Tx}$ rises and falls between the high voltage and the low voltage of the ASK modulation. The output of the slope detector 72, as illustrated in Plot B, may be a pulse, showing slope of $V_{Tx}$ rise and fall.

$V_{SD}$ is output to the comparator circuit(s) 74, which is configured to receive $V_{SD}$, compare $V_{SD}$ to a rising rate of change for the voltage ($V_{SUp}$) and a falling rate of change for the voltage ($V_{SLo}$). If $V_{SD}$ exceeds or meets $V_{SUp}$, then the comparator circuit will determine that the change in $V_{Tx}$ meets the rise threshold and indicates a rising edge in the ASK modulation. If $V_{SD}$ goes below or meets $V_{SLow}$, then the comparator circuit will determine that the change in $V_{Tx}$ meets the fall threshold and indicates a falling edge of the ASK modulation. It is to be noted that $V_{SUp}$ and $V_{SLo}$ may be selected to ensure a symmetrical triggering.

Figure 8:
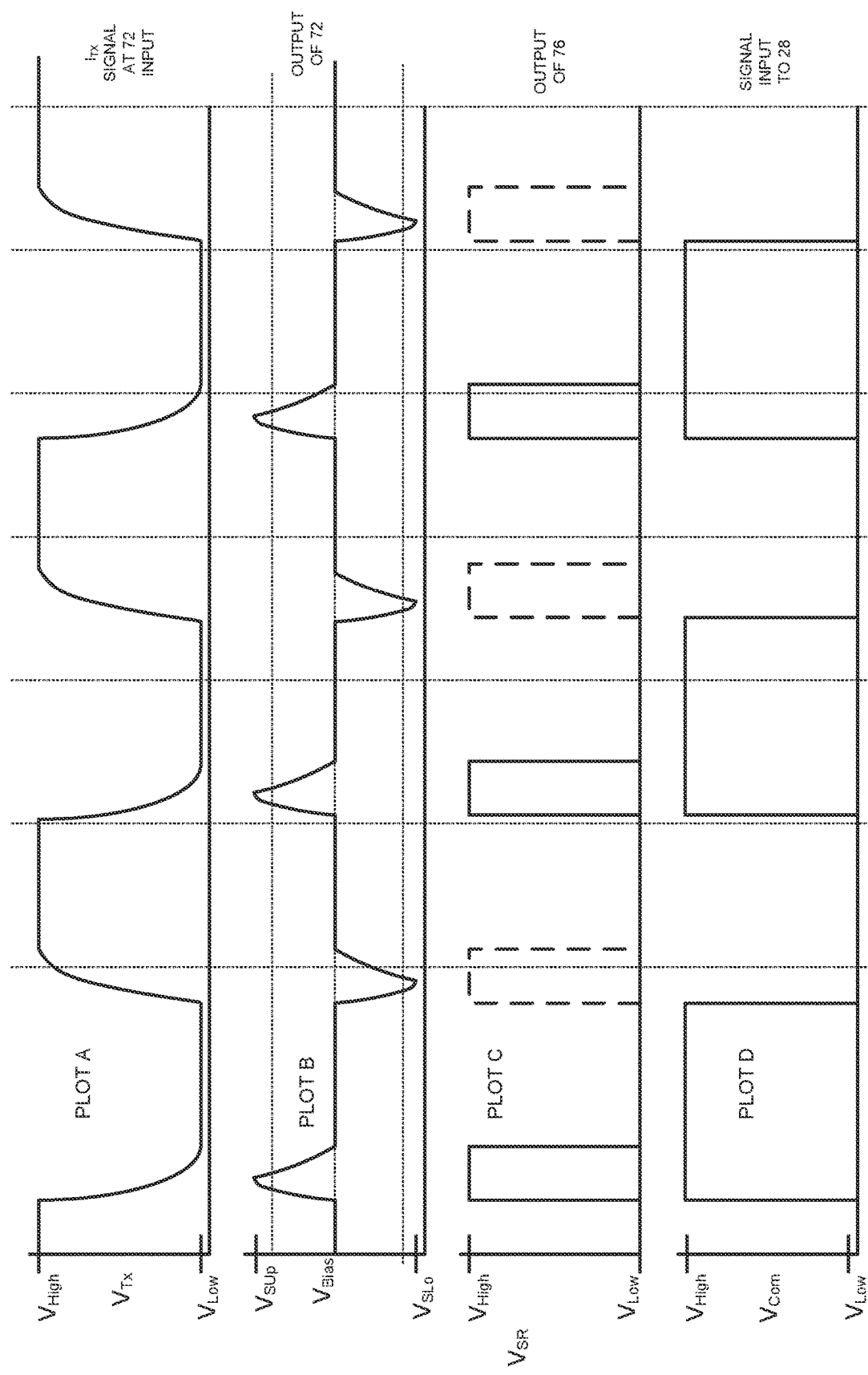
FIG. 8 is a timing diagram for voltages of an electrical signal, as it travels through the demodulation circuit, in accordance with FIGS. 1-7 and the present disclosure.

FIG. 8 is an exemplary timing diagram illustrating signal shape or waveform at various stages or sub-circuits of the demodulation circuit 70. The input signal to the demodulation circuit 70 is illustrated in FIG. 8 as Plot A, showing rising and falling edges from a "high" voltage ($V_{High}$) perturbation on the transmission antenna 21 to a "low" voltage ($V_{Low}$) perturbation on the transmission antenna 21. The voltage signal of Plot A may be derived from, for example, a current ($I_{TX}$) sensed at the transmission antenna 21 by one or more sensors of the sensing system 50. Such rises and falls from $V_{High}$ to $V_{Low}$ may be caused by load modulation, performed at the wireless receiver system(s) 30, to modulate the wireless power signals to include the wireless data signals via ASK modulation. As illustrated, the voltage of Plot A does not cleanly rise and fall when the ASK modulation is performed; rather, a slope or slopes, indicating rate(s) of change, occur during the transitions from $V_{High}$ to $V_{Low}$ and vice versa.

As illustrated in FIG. 7, the slope detector 72 includes a high pass filter 71, an operation amplifier (OpAmp) $OP_{SD}$, and an optional stabilizing circuit 73. The high pass filter 71 is configured to monitor for higher frequency components of the AC wireless signals and may include, at least, a filter capacitor ($C_{HF}$) and a filter resistor ($R_{HF}$). The values for $C_{HF}$ and $R_{HF}$ are selected and/or tuned for a desired cutoff frequency for the high pass filter 71. In some examples, the cutoff frequency for the high pass filter 71 may be selected as a value greater than or equal to about 1-2 kHz, to ensure adequately fast slope detection by the slope detector 72, when the operating frequency of the system 10 is on the order of MHz (e.g., an operating frequency of about 6.78 MHz). In some examples, the high pass filter 71 is configured such that harmonic components of the detected slope are unfiltered. In view of the current sensor 57 of FIG. 5, the high pass filter 71 and the low pass filter 55, in combination, may function as a bandpass filter for the demodulation circuit 70.

$OP_{SD}$ is any operational amplifier having an adequate bandwidth for proper signal response, for outputting the slope of $V_{Tx}$, but low enough to attenuate components of the signal that are based on the operating frequency and/or harmonics of the operating frequency. Additionally or alternatively, $OP_{SD}$ may be selected to have a small input voltage range for $V_{Tx}$, such that $OP_{SD}$ may avoid unnecessary error or clipping during large changes in voltage at $V_{Tx}$. Further, an input bias voltage ($V_{Bias}$) for $OP_{SD}$ may be selected based on values that ensure $OP_{SD}$ will not saturate under boundary conditions (e.g., steepest slopes, largest changes in $V_{Tx}$). It is to be noted, and is illustrated in Plot B of FIG. 8, that when no slope is detected, the output of the slope detector 72 will be $V_{Bias}$.

As the passive components of the slope detector 72 will set the terminals and zeroes for a transfer function of the slope detector 72, such passive components must be selected to ensure stability. To that end, if the desired and/or available components selected for $C_{HF}$ and $R_{HF}$ do not adequately set the terminals and zeros for the transfer function, additional, optional stability capacitor(s) $C_{ST}$ may be placed in parallel with $R_{HF}$ and stability resistor $R_{ST}$ may be placed in the input path to $OP_{SD}$.

Output of the slope detector 72 (Plot B representing $V_{SD}$) may approximate the following equation:

$$V_{SD} = -R_{HF}C_{HF}\frac{dV}{dt} + V_{Bias}$$

Thus, $V_{SD}$ will approximate to $V_{Bias}$, when no change in voltage (slope) is detected, and output $V_{SD}$ of the slope detector 72 is represented in Plot B. As can be seen, the value of $V_{SD}$ approximates $V_{Bias}$ when no change in voltage (slope) is detected, whereas $V_{SD}$ will output the change in voltage (dV/dt), as scaled by the high pass filter 71, when $V_{Tx}$ rises and falls between the high voltage and the low voltage of the ASK modulation. The output of the slope detector 72, as illustrated in Plot B, may be a pulse, showing slope of $V_{Tx}$ rise and fall.

$V_{SD}$ is output to the comparator circuit(s) 74, which is configured to receive $V_{SD}$, compare $V_{SD}$ to a rising rate of change for the voltage ($V_{SUp}$) and a falling rate of change for the voltage ($V_{SLo}$). If $V_{SD}$ exceeds or meets $V_{SUp}$, then the comparator circuit will determine that the change in $V_{Tx}$ meets the rise threshold and indicates a rising edge in the ASK modulation. If $V_{SD}$ goes below or meets $V_{SLow}$, then the comparator circuit will determine that the change in $V_{Tx}$ meets the fall threshold and indicates a falling edge of the ASK modulation. It is to be noted that $V_{SUp}$ and $V_{SLo}$ may be selected to ensure a symmetrical triggering.

In some examples, such as the comparator circuit 74 illustrated in FIG. 6, the comparator circuit 74 may comprise a window comparator circuit. In such examples, the $V_{SUp}$ and $V_{SLo}$ may be set as a fraction of the power supply determined by resistor values of the comparator circuit 74. In some such examples, resistor values in the comparator circuit may be configured such that $$V_{Sup} = V_{in}\left[\frac{R_{U2}}{R_{U1}+R_{U2}}\right]$$

$$V_{SLo} = V_{in}\left[\frac{R_{L2}}{R_{L1}+R_{L2}}\right]$$

where Vin is a power supply determined by the comparator circuit 74. When $V_{SD}$ exceeds the set limits for $V_{Sup}$ or $V_{SLo}$, the comparator circuit 74 triggers and pulls the output ($V_{Cout}$) low.

Further, while the output of the comparator circuit 74 could be output to the transmission controller 28 and utilized to decode the wireless data signals by signaling the rising and falling edges of the ASK modulation, in some examples, the SR latch 76 may be included to add noise reduction and/or a filtering mechanism for the slope detector 72. The SR latch 76 may be configured to latch the signal (Plot C) in a steady state to be read by the transmitter controller 28, until a reset is performed. In some examples, the SR latch 76 may perform functions of latching the comparator signal and serve as an inverter to create an active high alert out signal. Accordingly, the SR latch 76 may be any SR latch known in the art configured to sequentially excite when the system detects a slope or other modulation excitation. As illustrated, the SR latch 76 may include NOR gates, wherein such NOR gates may be configured to have an adequate propagation delay for the signal. For example, the SR latch 76 may include two NOR gates ($NOR_{Up}$, $NOR_{Lo}$), each NOR gate operatively associated with the upper voltage output 78 of the comparator 74 and the lower voltage output 79 of the comparator 74.

In some examples, such as those illustrated in Plot C, a reset of the SR latch 76 is triggered when the comparator circuit 74 outputs detection of $V_{SUp}$ (solid plot on Plot C) and a set of the SR latch 76 is triggered when the comparator circuit 74 outputs $V_{SLo}$ (dashed plot on Plot C). Thus, the reset of the SR latch 76 indicates a falling edge of the ASK modulation and the set of the SR latch 76 indicates a rising edge of the ASK modulation. Accordingly, as illustrated in Plot D, the rising and falling edges, indicated by the demodulation circuit 70, are input to the transmission controller 28 as alerts, which are decoded to determine the received wireless data signal transmitted, via the ASK modulation, from the wireless receiver system(s) 30.

The incoming signal VTX exemplified in the plots of FIG. 8 does not lead to excess bias or saturation because the values of $V_{BIAS}$ and $V_G$ are at appropriate levels, but the coupling environment may change (e.g., from strong to weak coupling), such that the existing $V_{BIAS}$ and $V_G$ are no longer appropriate and would no longer allow accurate signal detection. However, automatic gain and bias routines are applied as described herein to continually evaluate the system behavior and set $V_{BIAS}$ and $V_G$ such that accurate signal detection is provided throughout the range of allowable coupling strengths.

Figure 9:
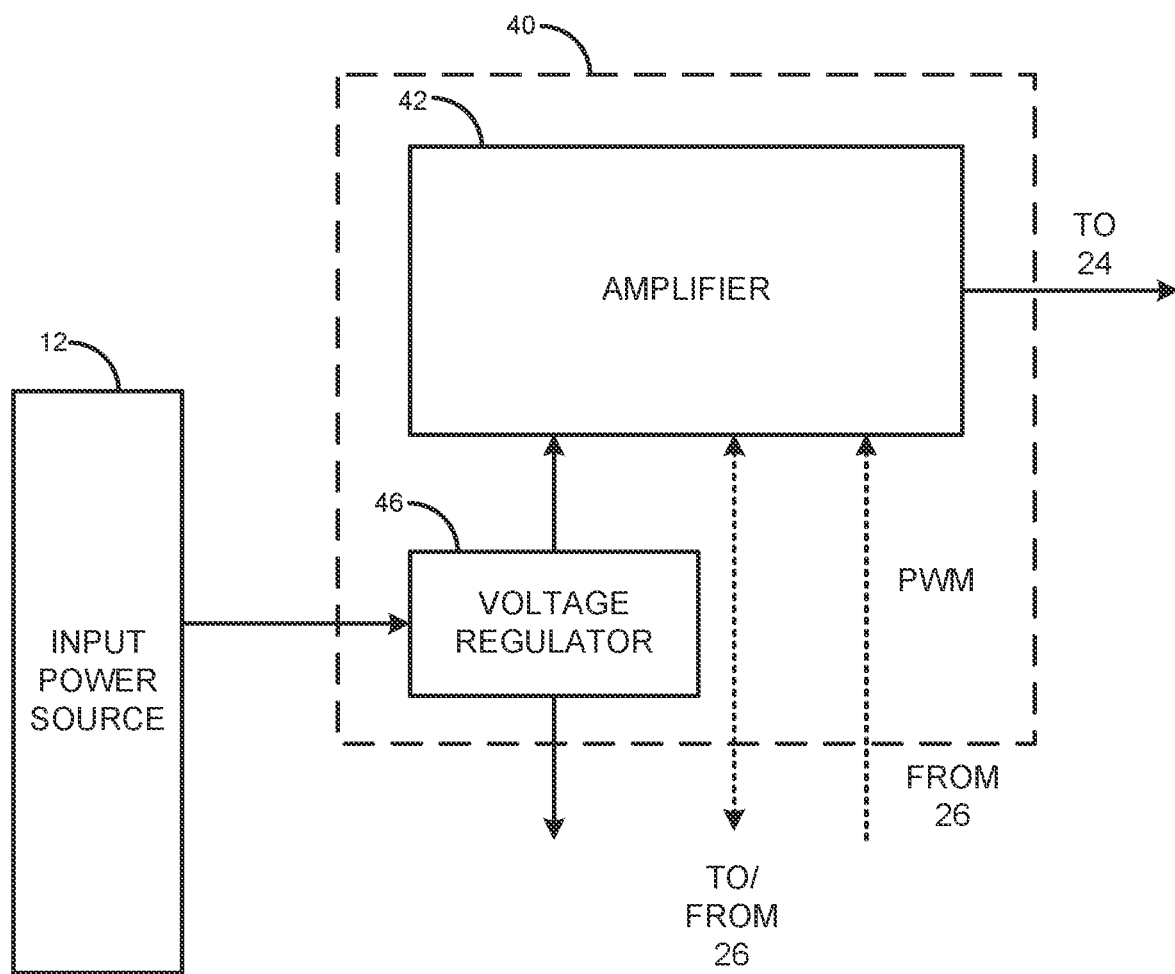
FIG. 9 is a block diagram illustrating components of a power conditioning system of the wireless transmission system of FIG. 2, in accordance with FIGS. 1-2, and the present disclosure.

Referring now to FIG. 9, and with continued reference to FIGS. 1-4, a block diagram illustrating an embodiment of the power conditioning system 40 is illustrated. At the power conditioning system 40, electrical power is received, generally, as a DC power source, via the input power source 12 itself or an intervening power converter, converting an AC source to a DC source (not shown). A voltage regulator 46 receives the electrical power from the input power source 12 and is configured to provide electrical power for transmission by the antenna 21 and provide electrical power for powering components of the wireless transmission system 21. Accordingly, the voltage regulator 46 is configured to convert the received electrical power into at least two electrical power signals, each at a proper voltage for operation of the respective downstream components: a first electrical power signal to electrically power any components of the wireless transmission system 20 and a second portion conditioned and modified for wireless transmission to the wireless receiver system 30. As illustrated in FIG. 3, such a first portion is transmitted to, at least, the sensing system 50, the transmission controller 28, and the communications system 29; however, the first portion is not limited to transmission to just these components and can be transmitted to any electrical components of the wireless transmission system 20.

The second portion of the electrical power is provided to an amplifier 42 of the power conditioning system 40, which is configured to condition the electrical power for wireless transmission by the antenna 21. The amplifier may function as an inverter, which receives an input DC power signal from the voltage regulator 46 and generates an AC as output, based, at least in part, on PWM input from the transmission control system 26. The amplifier 42 may be or include, for example, a power stage invertor, such as a single field effect transistor (FET), a dual field effect transistor power stage invertor or a quadruple field effect transistor power stage invertor. The use of the amplifier 42 within the power conditioning system 40 and, in turn, the wireless transmission system 20 enables wireless transmission of electrical signals having much greater amplitudes than if transmitted without such an amplifier. For example, the addition of the amplifier 42 may enable the wireless transmission system 20 to transmit electrical energy as an electrical power signal having electrical power from about 10 mW to about 500 W. In some examples, the amplifier 42 may be or may include one or more class-E power amplifiers. Class-E power amplifiers are efficiently tuned switching power amplifiers designed for use at high frequencies (e.g., frequencies from about 1 MHz to about 1 GHz). Generally, a single-ended class-E amplifier employs a single-terminal switching element and a tuned reactive network between the switch and an output load (e.g., the antenna 21). Class E amplifiers may achieve high efficiency at high frequencies by only operating the switching element at points of zero current (e.g., on-to-off switching) or zero voltage (off to on switching). Such switching characteristics may minimize power lost in the switch, even when the switching time of the device is long compared to the frequency of operation. However, the amplifier 42 is certainly not limited to being a class-E power amplifier and may be or may include one or more of a class D amplifier, a class EF amplifier, an H invertor amplifier, and/or a push-pull invertor, among other amplifiers that could be included as part of the amplifier 42.

Figure 10:
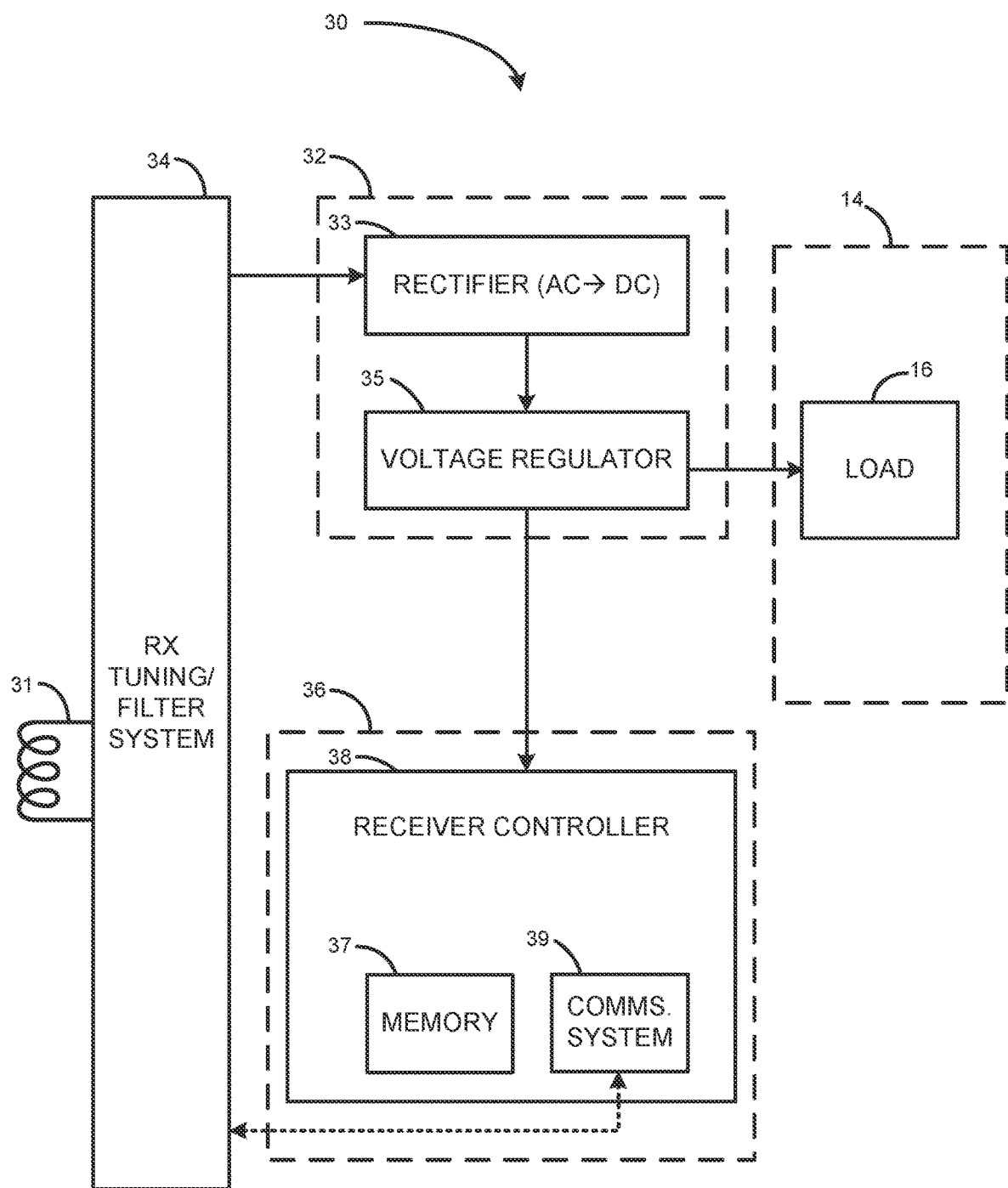
FIG. 10 is a block diagram illustrating components of a receiver control system and a receiver power conditioning system of the wireless receiver system of FIGS. 2, in accordance with FIGS. 1-2, and the present disclosure.

Turning now to FIG. 10 and with continued reference to, at least, FIGS. 1 and 2, the wireless receiver system 30 is illustrated in further detail. The wireless receiver system 30 is configured to receive, at least, electrical energy, electrical power, electromagnetic energy, and/or electrically transmittable data via near field magnetic coupling from the wireless transmission system 20, via the transmission antenna 21. As illustrated in FIG. 9, the wireless receiver system 30 includes, at least, the receiver antenna 31, a receiver tuning and filtering system 34, a power conditioning system 32, a receiver control system 36, and a voltage isolation circuit 70. The receiver tuning and filtering system 34 may be configured to substantially match the electrical impedance of the wireless transmission system 20. In some examples, the receiver tuning and filtering system 34 may be configured to dynamically adjust and substantially match the electrical impedance of the receiver antenna 31 to a characteristic impedance of the power generator or the load at a driving frequency of the transmission antenna 20.

As illustrated, the power conditioning system 32 includes a rectifier 33 and a voltage regulator 35. In some examples, the rectifier 33 is in electrical connection with the receiver tuning and filtering system 34. The rectifier 33 is configured to modify the received electrical energy from an alternating current electrical energy signal to a direct current electrical energy signal. In some examples, the rectifier 33 is comprised of at least one diode. Some non-limiting example configurations for the rectifier 33 include, but are not limited to including, a full wave rectifier, including a center tapped full wave rectifier and a full wave rectifier with filter, a half wave rectifier, including a half wave rectifier with filter, a bridge rectifier, including a bridge rectifier with filter, a split supply rectifier, a single phase rectifier, a three phase rectifier, a voltage doubler, a synchronous voltage rectifier, a controlled rectifier, an uncontrolled rectifier, and a half controlled rectifier. As electronic devices may be sensitive to voltage, additional protection of the electronic device may be provided by clipper circuits or devices. In this respect, the rectifier 33 may further include a clipper circuit or a clipper device, which is a circuit or device that removes either the positive half (top half), the negative half (bottom half), or both the positive and the negative halves of an input AC signal. In other words, a clipper is a circuit or device that limits the positive amplitude, the negative amplitude, or both the positive and the negative amplitudes of the input AC signal.

Some non-limiting examples of a voltage regulator 35 include, but are not limited to, including a series linear voltage regulator, a buck convertor, a low dropout (LDO) regulator, a shunt linear voltage regulator, a step up switching voltage regulator, a step down switching voltage regulator, an inverter voltage regulator, a Zener controlled transistor series voltage regulator, a charge pump regulator, and an emitter follower voltage regulator. The voltage regulator 35 may further include a voltage multiplier, which is as an electronic circuit or device that delivers an output voltage having an amplitude (peak value) that is two, three, or more times greater than the amplitude (peak value) of the input voltage. The voltage regulator 35 is in electrical connection with the rectifier 33 and configured to adjust the amplitude of the electrical voltage of the wirelessly received electrical energy signal, after conversion to AC by the rectifier 33. In some examples, the voltage regulator 35 may an LDO linear voltage regulator; however, other voltage regulation circuits and/or systems are contemplated. As illustrated, the direct current electrical energy signal output by the voltage regulator 35 is received at the load 16 of the electronic device 14. In some examples, a portion of the direct current electrical power signal may be utilized to power the receiver control system 36 and any components thereof; however, it is certainly possible that the receiver control system 36, and any components thereof, may be powered and/or receive signals from the load 16 (e.g., when the load 16 is a battery and/or other power source) and/or other components of the electronic device 14.

The receiver control system 36 may include, but is not limited to including, a receiver controller 38, a communications system 39 and a memory 37. The receiver controller 38 may be any electronic controller or computing system that includes, at least, a processor which performs operations, executes control algorithms, stores data, retrieves data, gathers data, controls and/or provides communication with other components and/or subsystems associated with the wireless receiver system 30. The receiver controller 38 may be a single controller or may include more than one controller disposed to control various functions and/or features of the wireless receiver system 30. Functionality of the receiver controller 38 may be implemented in hardware and/or software and may rely on one or more data maps relating to the operation of the wireless receiver system 30. To that end, the receiver controller 38 may be operatively associated with the memory 37. The memory may include one or both of internal memory, external memory, and/or remote memory (e.g., a database and/or server operatively connected to the receiver controller 38 via a network, such as, but not limited to, the Internet). The internal memory and/or external memory may include, but are not limited to including, one or more of a read only memory (ROM), including programmable read-only memory (PROM), erasable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5), a flash memory, a portable memory, and the like. Such memory media are examples of nontransitory computer readable memory media.

Further, while particular elements of the receiver control system 36 are illustrated as subcomponents and/or circuits (e.g., the memory 37, the communications system 39, among other contemplated elements) of the receiver control system 36, such components may be external of the receiver controller 38. In some examples, the receiver controller 38 may be and/or include one or more integrated circuits configured to include functional elements of one or both of the receiver controller 38 and the wireless receiver system 30, generally. As used herein, the term "integrated circuits" generally refers to a circuit in which all or some of the circuit elements are inseparably associated and electrically interconnected so that it is considered to be indivisible for the purposes of construction and commerce. Such integrated circuits may include, but are not limited to including, thin-film transistors, thick-film technologies, and/or hybrid integrated circuits.

In some examples, the wireless power transmission system 20 may be configured to transmit power over a large charge area, within which the wireless power receiver system 30 may receive said power. A "charge area" may be an area associated with and proximate to a wireless power transmission system 20 and/or a transmission antenna 21 and within said area a wireless power receiver 30 is capable of coupling with the transmission system 20 or transmission antenna 21 at a plurality of points within the charge area. To that end, it is advantageous, both for functionality and user experience, that the plurality of points for coupling within a charge area include as many points as possible and with as much of a consistent ability to couple with a receiver system 30, within the given charge area. In some examples, a "large charge area" may be a charge area wherein the X-Y axis spatial freedom is within an area bounded by a width (across the area, or in an "X" axis direction) of about 150 mm to about 500 mm and bounded by a length (height of the area, or in an "Y" axis direction) of about 50 mm to about 350 mm. While the following antennas 21 disclosed are applicable to "large area" or "large charge area" wireless power transmission antennas, the teachings disclosed herein may also be applicable to transmission or receiver antennas having smaller or larger charge areas, then those discussed above.

It is advantageous for large area power transmitters to be designed with maximum uniformity of power transmission in mind. Thus, it may be advantageous to design such transmission antennas 21 with uniformity ratio in mind. "Uniformity ratio," as defined herein, refers to the ratio of a maximum coupling, between a wireless transmission system 20 and wireless receiver system 30, to a minimum coupling between said systems 20, 30, wherein said coupling values are determined by measuring or determining a coupling between the systems 20, 30 at a plurality of points at which the wireless receiver system 30 and/or antenna 31 are placed within the charge area of the transmission antenna 21. In other words, the uniformity ratio is a ratio between the coupling when the receiver antenna 31 is positioned at a point, relative to the transmission antenna 21 area, that provides the highest coupling ($C_{MAX}$) versus the coupling when the receiver antenna 31 is positioned at a point, relative to the charge area of the transmission antenna 21, that provides for the lowest coupling ($C_{MIN}$). Thus, uniformity ratio for a charge area ($U_{AREA}$) may be defined as:

$$U_{AREA}=C_{MAX}/C_{MIN}.$$

To that end, a perfectly uniform charge area would have a uniformity ratio of 1, as $C_{MAX}=C_{MIN}$ for a fully uniform charge area.

Further, while uniformity ratio can be enhanced by using more turns, coils, and/or other resonant bodies within an antenna, increasing such use of more conductive metals to maximize uniformity ratio may give rise to cost concerns, bill of material concerns, environmental concerns, and/or sustainability concerns, among other known drawbacks from inclusion of more conductive materials. To that end, the following transmission antennas 21 may be designed by balancing uniformity ratio considerations with cost, environmental, and/or sustainability considerations. In other words, the following transmission antennas 21 may be configured to achieve an increased (e.g., maximized) uniformity ratio, while reducing (e.g., minimizing) the use or the length of conductive wires and/or traces.

Further, while the following antennas 21 may be embodied by PCB or flex PCB antennas, in some examples, the following antennas 21 may be wire wound antennas that eschew the use of any standard PCB substrate. By reducing or perhaps even eliminating the use of PCB substrate, cost and or environmental concerns associated with PCB substrates may be reduced and/or eliminated.

Figure 11A:
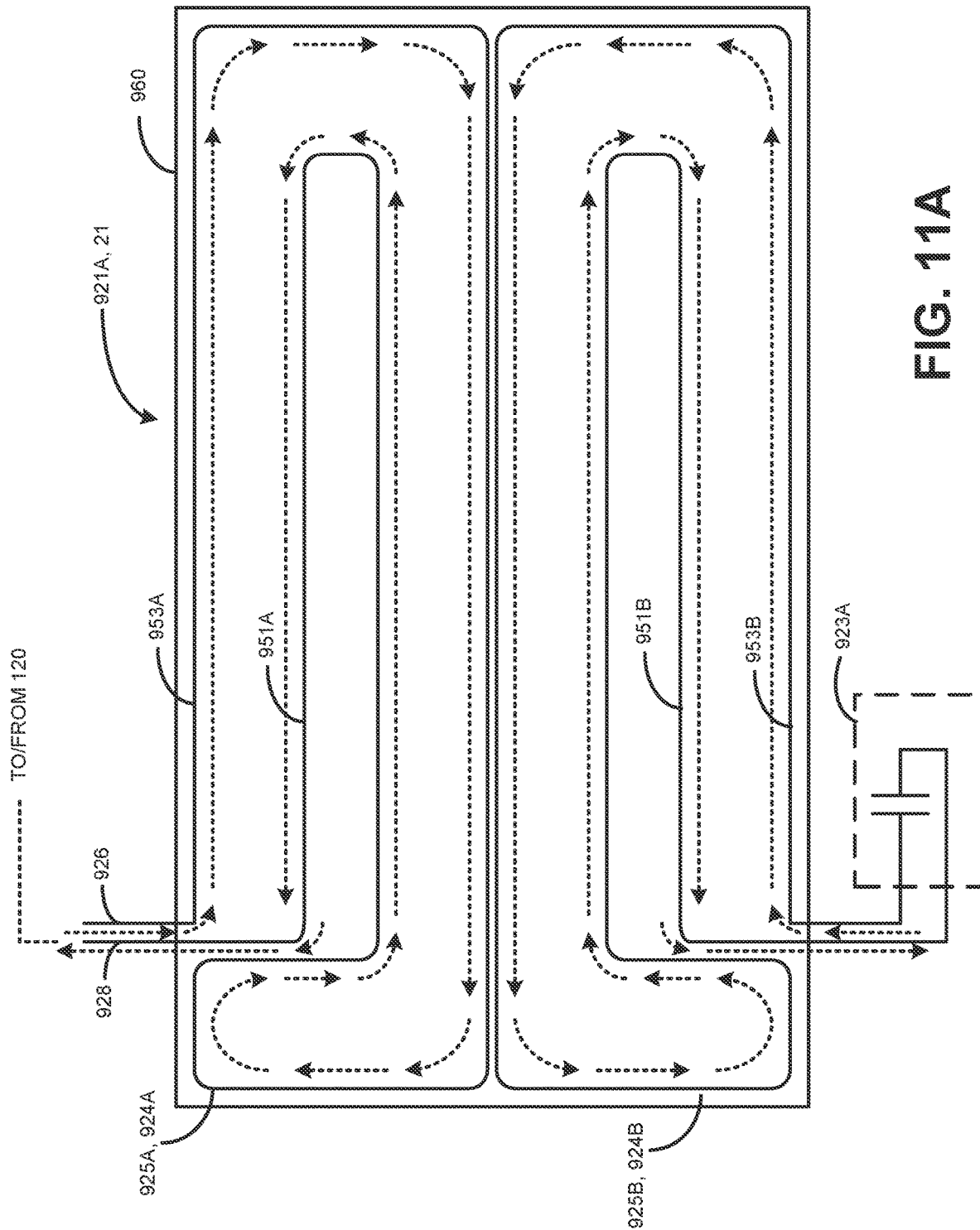
FIG. 11A is a top view of a wireless power transmission antenna having a source coil and an internal repeater coil, in accordance with FIGS. 1-9 and the present disclosure.

Turning now to FIG. 11A, another example of a wireless power transmission antenna 921A, for transmitting wireless power to a receiver system 30 over a large charge area, is illustrated. The antenna 921A may be utilized as the transmission antenna 21 in any of the aforementioned wireless transmission systems 20. The transmission antenna(s) 925 include multiple transmission coils 925, wherein at least one transmission coil is a source coil 925A and at least one transmission coil 925 is an internal repeater coil 925B. The source coil 925A is comprised of a first continuous conductive wire 924A and includes a first outer turn 953A and a first inner turn 951A. While illustrated with only one first outer turn 953A and one first inner turn 951A, it is certainly contemplated that the antenna 921A may include multiple outer turns 953A and inner turns 951A. The source coil 925A is configured to connect to one or more electronic components 120 of the wireless transmission system 20. The first conductive wire begins at a first source terminal 926, which leads to or is part of the beginning of the first outer turn 951A, and ends at a second source terminal, which is associated or is part of the ending 928 of the first inner turn 951A.

The internal repeater coil 925B may take a similar shape to that of the source coil 925A, but is not directly, electrically connected to the one or more electrical components 120 of the wireless transmission system 20. Rather, the internal repeater coil 925B is a repeater configured to have a repeater current induced in it by the source coil 925A.

As defined herein, a "repeater" is an antenna or coil that is configured to relay magnetic fields emanating between a transmission antenna (e.g., the source coil 925A) and one or both of a receiver antenna 31 and one or more other antennas or coils, when such subsequent coils or antennas are configured as repeaters. Thus, the internal repeater coil 925B may be configured to relay electrical energy and/or data via NMFC from the initial transmitting antenna (e.g., the source coil 925A) to a receiver antenna 31 or to another repeating antenna or coil. In one or more embodiments, such repeating coils or antennas (e.g., the repeater coil 925B) comprise an inductor coil capable of resonating at a frequency that is about the same as the resonating frequency of the initial transmitting antenna (e.g. the source coil 925A) and the receiver antenna 31. Further, it is certainly possible that an initial transmitting antenna may transfer electrical signals and/or couple with one or more other antennas (repeaters or receivers) and transfer, at least in part, components of the output signals or magnetic fields of the transmitting antenna. Such transmission may include secondary and/or stray coupling or signal transfer to multiple antennas of the system(s) 10, 20, 30.

As mentioned, the coil 925B is referred to as an "internal repeater" to either the transmission antenna 921, 21 and/or the wireless transmission system 20, as it is contained as part of a common system 20 or antenna 921, 21. An "internal repeater" as defined herein is a repeater coil or antenna that is utilized as part of a unitary antenna, rather than as a repeater outside the bounds of the overall system. For example, a user of the wireless power transmission system 20 would not know the difference between a system 20 with an internal repeater and one in which all coils are wired to the electrical components 120, so long as both systems are housed in an opaque mechanical housing (e.g., a mechanical housing 960). Internal repeaters may be beneficial for use in unitary wireless transmission antennas because they allow for longer wires for coils, without introducing electromagnetic interference (EMI) that are associated with longer wires connected to a common wired signal source. Additionally or alternatively, use of internal repeaters may be beneficial in improving metal resiliency and/or uniformity ratio for the wireless transmission antenna(s) 21.

Configuration of the inner turns 951 and outer turns 953, with respect to one another, of the coils 925 is designed for controlling a direction of current flow through each of the coils 925. Current flow direction is illustrated by the dotted lines in FIG. 11A. As illustrated, the current may enter the source coil 925A, from the one or more electrical components 120, at the first source terminal at the beginning of the first outer turn 953A and then flow through the first outer turn in a first source coil direction. Said source coil direction may be, for example, a clockwise direction, as illustrated. Then, at the end of the first outer turn 953A, where the first outer turn 953A turns into the first inner turn 951A, the current will change directions to a second source direction, which is substantially opposite of the first source direction. In some examples and as illustrated, the second source direction may be a counter-clockwise direction, which is substantially opposite of the clockwise direction of the current flow through the first outer turn 953A.

The internal repeater coil 925B is configured such that a current is induced in it by the source coil 925A and direction(s) of the current induced in the internal repeater coil 925B is/are illustrated by the dotted lines in FIG. 11A. The induced current of the internal repeater coil 925B may have a first repeater direction, flowing through the second outer turn 953B of the internal repeater coil 925B. The first repeater direction may be, for example and as illustrated, a counter-clockwise direction. Then, at the end of the second outer turn 953B, where the second outer turn 953B turns into the second inner turn 951B, the current will change directions to a second repeater direction, which is substantially opposite of the first repeater direction, In some examples and as illustrated, the second source direction may be a clockwise direction, which is substantially opposite of the counter-clockwise direction of the current flow through the second outer turn 953B.

As illustrated and described, the first repeater direction (counter-clockwise) may be substantially opposite of the first source direction (clockwise). Thus, as one views the antenna 921 both from left-to-right and from top-to-bottom, the current direction reverses from turn to turn. By reversing current directions from turn-to-turn both laterally (side to side) and from top-to-bottom, optimal field uniformity may be maintained. By reversing current directions amongst inner and outer turns 951, 953, both laterally and top-to-bottom, a receiver antenna 31 travelling across the charge area of the antenna 921 will more often be positioned more closer-to-perpendicular with the magnetic field emanating from the antenna 921. Thus, as a receiver antenna 31 will best couple with the transmission antenna 921 at points of perpendicularity with the magnetic field, the charge area generated by the antenna 921 will have greater uniformity than if all of the turns 951, 953 carried the current in a common direction.

As illustrated, the source coil 925A and the internal repeater coil 925B may be configured to be housed in a common, unitary housing 960. By utilizing the internal repeater coil 925B, rather than one larger source coil, EMI benefits may be seen, as a shorter wire connected to the source may reduce EMI issues. Additionally, by utilizing the internal repeater coil 925B, the aforementioned reversals of current direction may be better achieved, which enhances uniformity and metal resilience in the transmission antenna 921.

In some examples, while the internal repeater coil 925B may be a "passive" inductor (e.g., not connected directly, by wired means, to a power source), it still may be connected to one or more components of a repeater tuning system 923A. The repeater tuning system 923A may include one or more components, such as a tuning capacitor, configured to tune the internal repeater coil 925B to operate at an operating frequency similar to that of the source coil 925A and/or any receiver antenna(s) 31, to which the repeater coil 925B intends to transfer wireless power. The repeater tuning system 923A may be positioned, in a signal path of the internal repeater coil 925B, connecting the beginning of the second outer turn 953B and the ending of the second inner turn 951B, as illustrated.

One or more of the source coil 925A, the internal repeater coil 925B, and combinations thereof may form or combine to form a substantially rectangular shape, as illustrated. In some examples, such substantially rectangular shape(s) of one or more of the source coil 925A, the internal repeater coil 925B, and combinations thereof may additionally have rounded edges, as illustrated in FIG. 11A. In some such examples, shape of the coils 925A, 925B may both be oriented in a "column" type rectangular formation, wherein, when viewed in a top view perspective, the coils 925A,B are arranged from top to bottom in a singular row. Alternatively, as illustrated in FIG. 11B and including like and/or similar elements to those of FIG. 11A as indicated by like reference numbers, the coils 925C, D of FIG. 11B may be arranged in a "row" type formation, where the coils 925C, D are arranged next to one another in a "side-to-side" lateral fashion. Any of the subsequently discussed antennas 921 having a source-internal repeater configuration may have either a "row formation" or a "column formation."

Figure 11C:
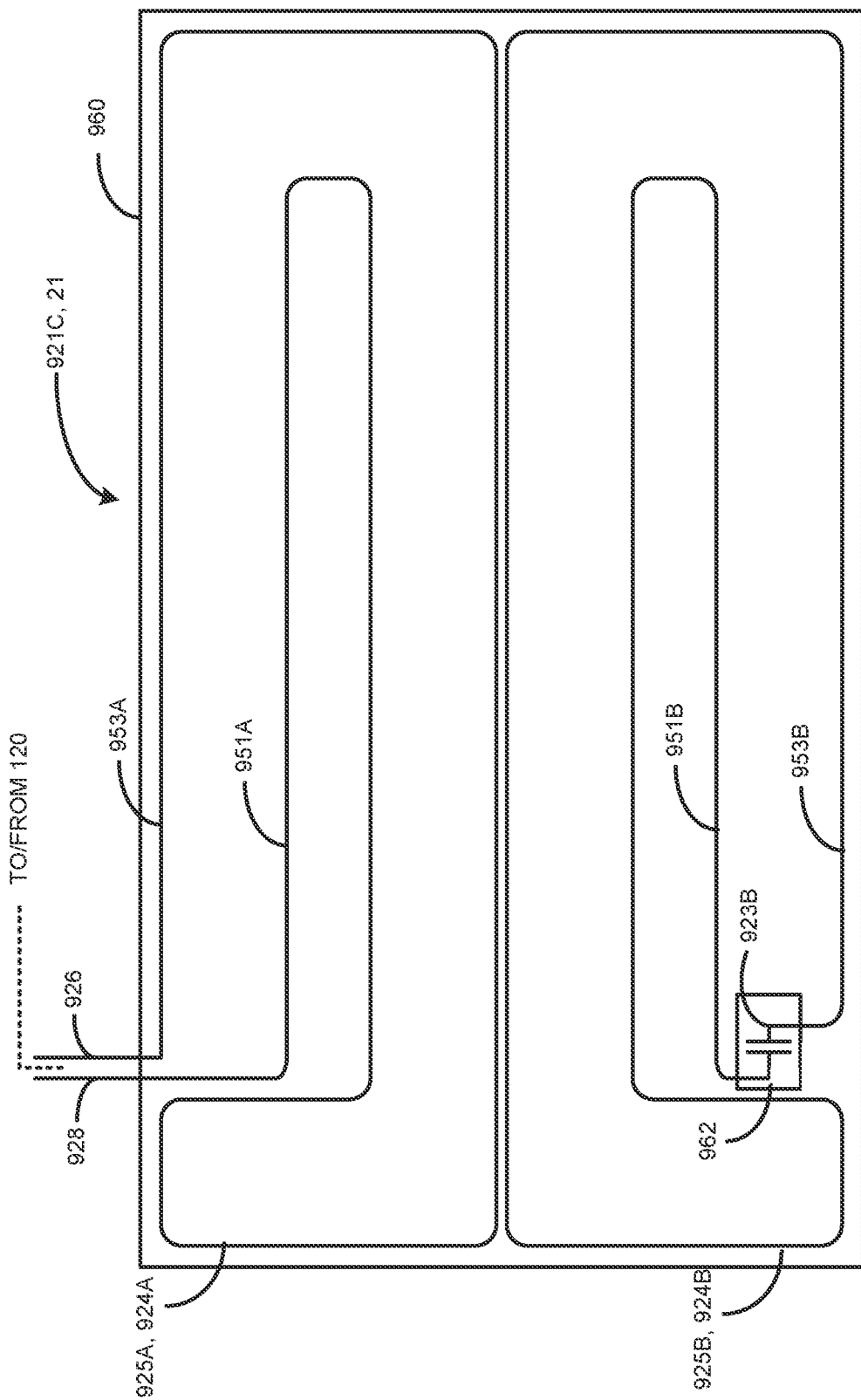
FIG. 11C is a top view of a wireless power transmission antenna having a source coil and an internal repeater coil, with tuning capacitors internal of the inner repeater coil, in accordance with FIGS. 1-9, 11A-B, and the present disclosure.
Figure 11D:
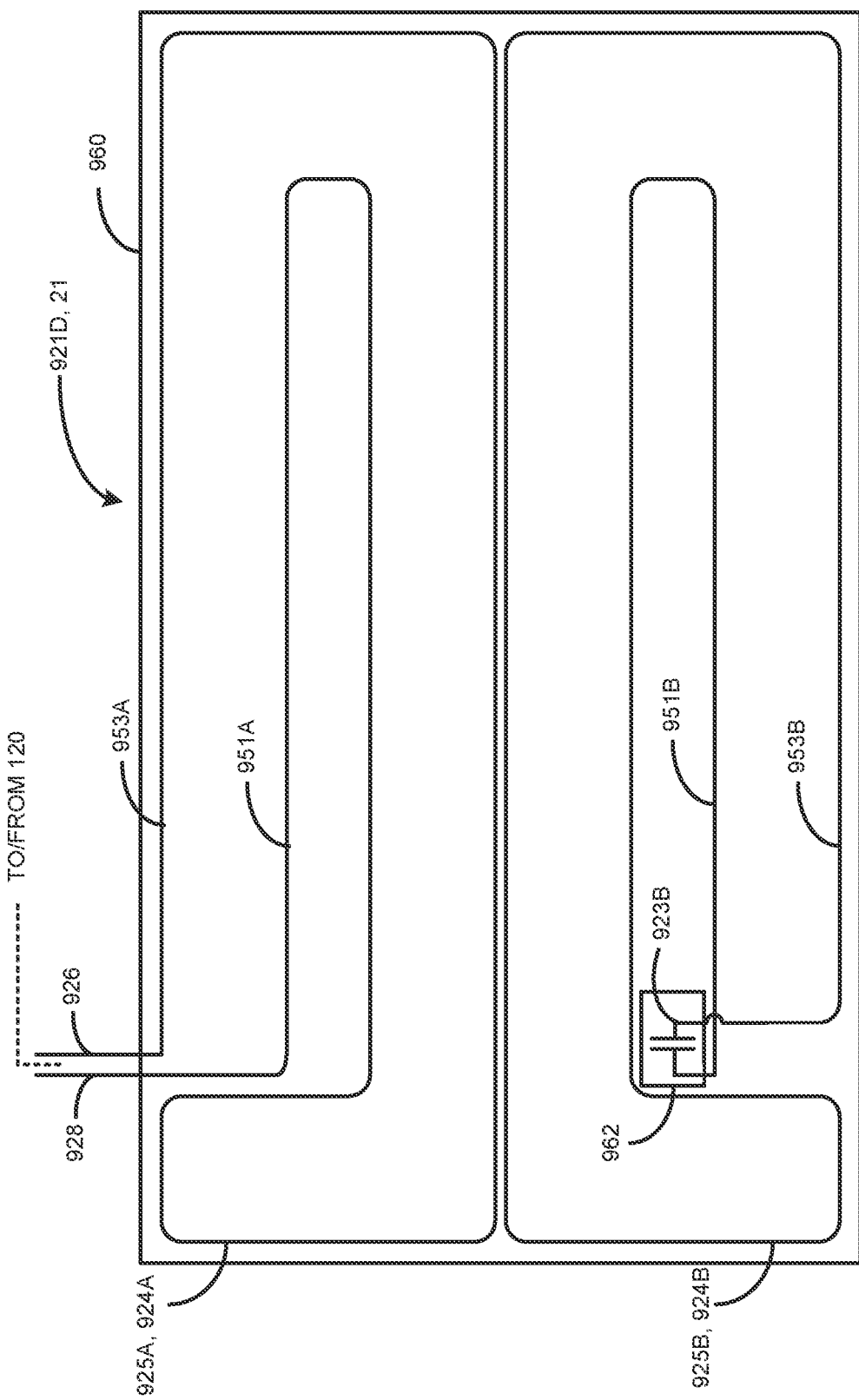
FIG. 11D is a top view of another wireless power transmission antenna having a source coil and an internal repeater coil, with tuning capacitors internal of the inner repeater coil, in accordance with FIGS. 1-9, 11A-C, and the present disclosure.

FIG. 11C is another example of a transmission antenna 921C that has a source-internal repeater configuration, similar to those of FIGS. 11A, 11B and, thus, including like or similar elements to those of FIGS. 11A, 11B, which share common reference numbers and descriptions herein. The antenna 921C includes a repeater tuning system 923B, which is functionally equivalent to the repeater tuning system 923A of FIGS. 11A, 11B, but is disposed within the bounds of the inner repeater coil 925B. For example, the repeater tuning system 923B may be disposed on a substrate 962 that is independent of the one or more electrical components 120 of the wireless transmission system 20. In such examples, the substrate 962 and/or the tuning system 923B absent a substrate may be positioned radially inward of the second outer turn 953B, as illustrated in FIG. 11C. Alternatively, as illustrated in an antenna 921D of FIG. 11D, which includes like or similar elements to those of FIGS. 11A-C which share common reference numbers and descriptions herein, the tuning system 923B may be similarly connected to the outer and inner turns 953B, 951B, but the tuning system 923B and/or the associated substrate 962 may be positioned radially inward of the second inner turn 951B.

In some examples wherein the repeater tuning system 923B is disposed radially inward of the second outer turn 953B, one or more capacitors of the repeater tuning system 923B may be interdigitated capacitors. An interdigitated capacitor is an element for producing capacitor-like characteristics by using microstrip lines, which can be disposed as conductive materials on a substrate or other surface. To that end, capacitors of the repeater tuning system 923B may be interdigitated capacitors disposed on the substrate 962. Additionally or alternatively, interdigitated capacitors of the repeater tuning system 923B may be disposed on another surface, such as a dielectric surface of the housing 960.

By disposing the repeater tuning system within or in close proximity to the internal repeater coil 925B, long wires extending to a circuit board, such as one associated with the one or more components 120, may be omitted. By omitting such long wires, complexity of manufacture may be reduced. Additionally or alternatively, by shortening the connection to the tuning system 923B by keeping it close by the internal repeater coil 925B, EMI concerns related to long connecting wires may be mitigated.

Figure 11E:
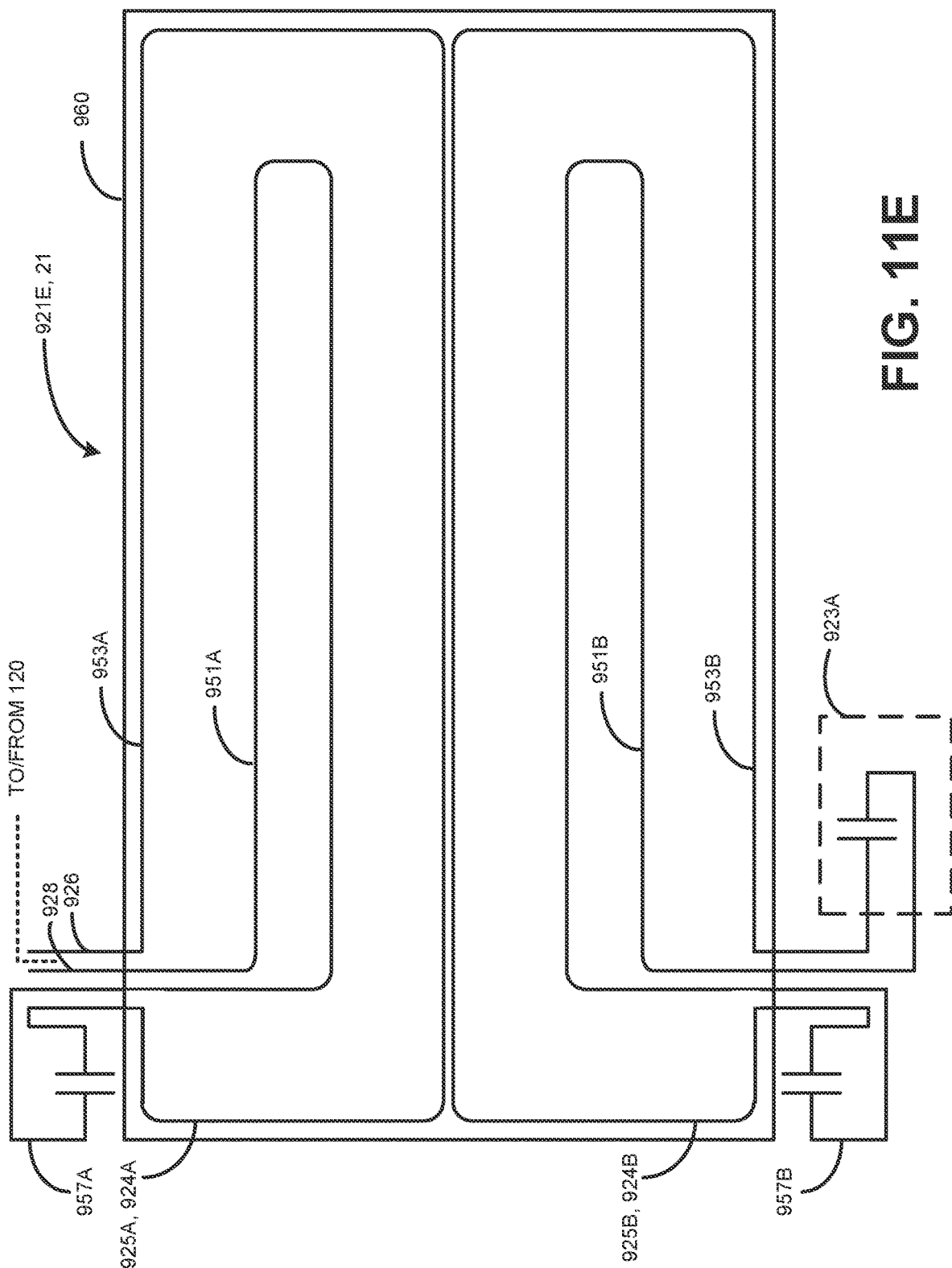
FIG. 11E is a top view of a wireless power transmission antenna having a source coil and an internal repeater coil, with inter-turn capacitors, in accordance with FIGS. 1-9, 11A-D, and the present disclosure.

Turning now to FIG. 11E, another example of an antenna 921E is illustrated, the antenna 921E having a source-internal repeater configuration, similar to those of FIGS. 11A-D and, thus, including like or similar elements to those of FIGS. 11A-D, which share common reference numbers and descriptions herein. In contrast to the antennas 921 of FIGS. 11A-D, the source coil 925A and the internal repeater coil 925B of include, respectively, inter-turn capacitors 957A, 957B. An inter-turn capacitor may be any capacitor that is disposed in between the inner and outer turns 951, 953 of either a source coil 925A or an internal repeater coil 925B. The inter-turn capacitors 957 may be configured to mitigate electronic field (or E-Field) emissions generated by one or both of the antenna(s) 921 and the one or more electrical components 120.

The use of inter-turn capacitors 957 in the antenna 921E may decrease sensitivity of the antenna 921E, with respect to parasitic capacitances or capacitances outside of the scope of wireless power transfer (e.g., a natural capacitance of a human limb or body). Thus, the antenna 921E may be less affected by such parasitic capacitances, when introduced to the field generated by the antenna 921E, when compared to antennas 21 not including inner turn capacitors 957. The inner turn capacitor 957, further, may be tuned to maintain phase of the AC signals throughout the respective coils 925 and, thus, values of the inter-turn capacitors 957 may be based on one or more of an operating frequency for the system(s) 10, 20, 30, inductance of each turn of the coils 925, and/or length of the continuous conductive wire 924 of a respective coil 925. By maintaining phase through a coil 925 with the inter-turn capacitors 957, excess or unwanted E-field emissions may be mitigated, as there is less variance in voltages across a coil 925.

The inter-turn capacitors 957 may be tuned to prevent E-Field emissions, such that the wireless power transmission system 20 can properly operate within statutory or standards-body based guidelines. For example, the inter-turn capacitors may be tuned to reduce E-field emissions such that the wireless transmission system 20 is capable of proper operations within radiation limits defined by the International Commission on Non-Ionizing Radiation Protection (ICNIRP).

Figure 11F:
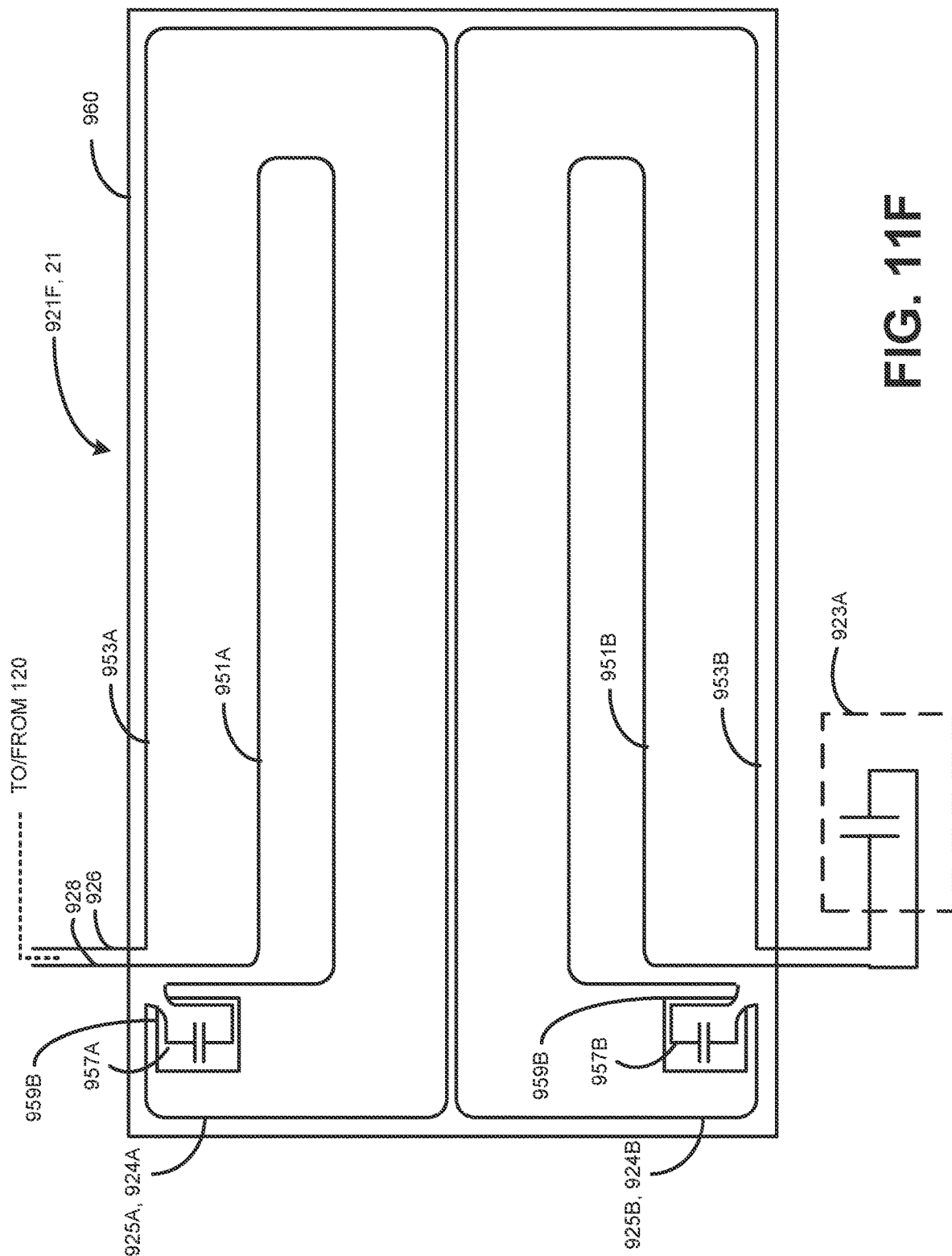
FIG. 11F is a top view of another wireless power transmission antenna having a source coil and an internal repeater coil, with inter-turn capacitors, in accordance with FIGS. 1-9, 11A-E, and the present disclosure.

Further still, the inter-turn capacitors 957 may be positioned within bounds of the outer turns 953 of the coils 925, as best illustrated in an antenna 921E of FIG. 11F, which has a source-internal repeater configuration, similar to those of FIGS. 11A-D and, thus, including like or similar elements to those of FIGS. 11A-E, which share common reference numbers and descriptions herein. In some such examples, the inter turn capacitors 957 are disposed on a substrate 959 that is positioned radially inward of an outer turn 953. In some such examples, the inter-turn capacitors 957 may be interdigitated capacitors. Further still, in some such examples, interdigitated inter-turn capacitors 957 may be disposed on a dielectric surface of the housing 960.

Figure 11G:
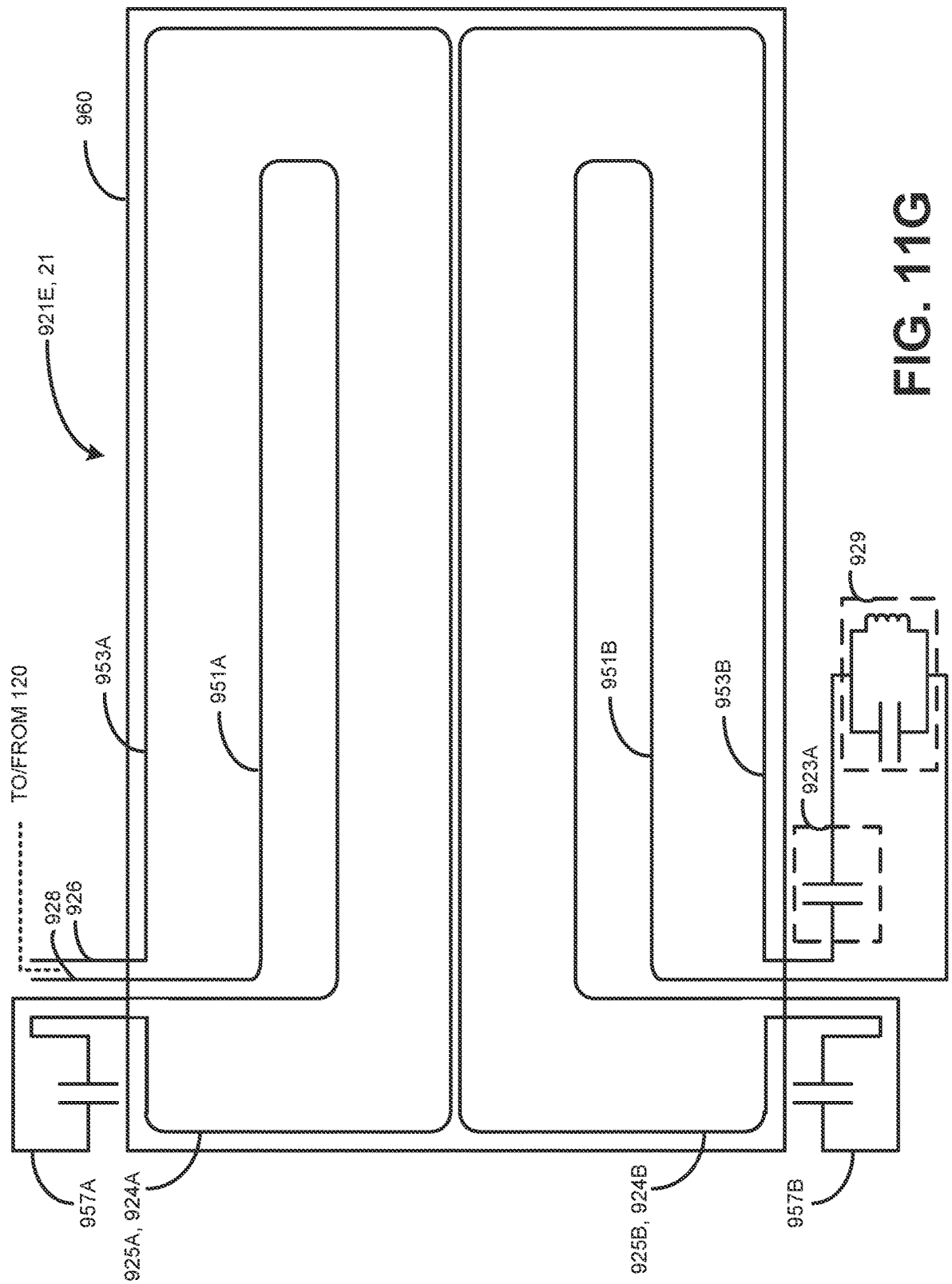
FIG. 11G is a top view of another wireless power transmission antenna having a source coil and an internal repeater coil, with a repeater filter, in accordance with FIGS. 1-9, 11A-F, and the present disclosure

FIG. 11G is another example of an antenna 921G having the source coil 925A formed of the first continuous conductive wire 924A and the internal repeater coil 925B, formed of the second continuous conductive wire 924B. The antenna 921G, when compared to the other antenna(s) 921A-F, additionally includes a repeater filter circuit 929. The repeater filter circuit 929 may be in series with the repeater tuning system 923A and be positioned, in the signal path of the second continuous conductive wire, between a beginning of the second outer turn 953B and an ending of the second inner turn 951B. The repeater filter circuit 929 may be an LC filter circuit, of any complexity, including at least one inductor ("L") and at least one capacitor ("C"). In some examples, the repeater filter circuit 929 may be configured as an EMI filter circuit 929, configured to reduce or eliminate EMI emanating from the repeater coil 925B. Additionally or alternatively, the filter circuit 929 may be used or be useful in reducing sensitivity of the internal repeater coil 925B and/or the transmission antenna 921G itself. Thus, inclusion of the filter circuit 929 may introduce an additional impedance to the systems 10, 20, 30, which may further reduce sensitivity to parasitic capacitances within the charge area of the antenna 921G. While not shown, it is certainly possible that the circuit components repeater filter circuit 929 is positioned on a substrate within the bounds of the second outer turn 953B, within the bounds of the second inner turn 951B, or on a common substrate or circuit board as the one or more components 120 of the wireless transmission system 120.

Figure 11H:
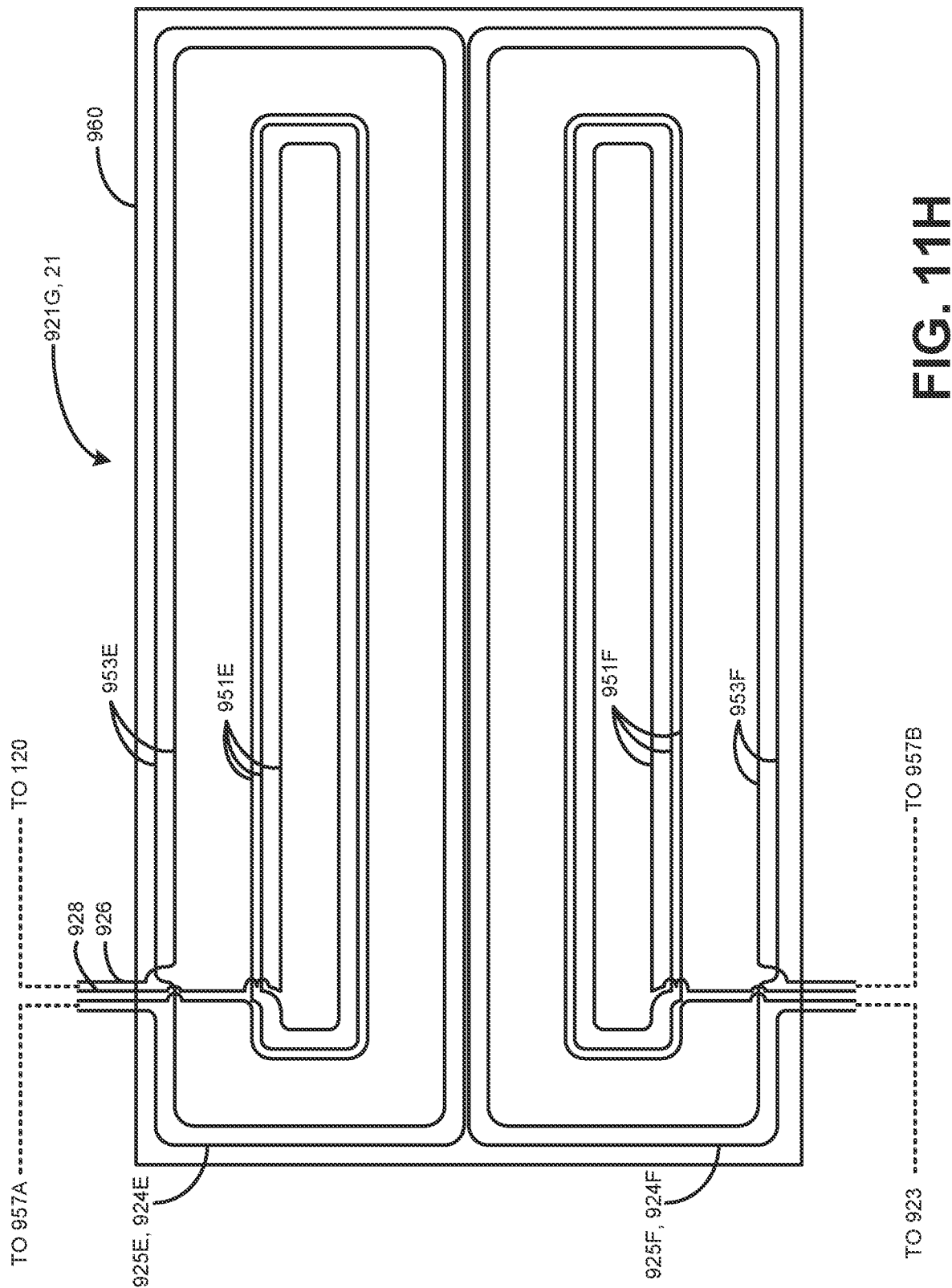
FIG. 11H is a top view of another wireless power transmission antenna having a source coil and an internal repeater coil, each coil having a plurality of turns, in accordance with FIGS. 1-9, 11A-G, and the present disclosure.

Turning now to FIG. 11H, another antenna 921H is illustrated, having a source coil 925E and repeater coil 925F configuration and, thus, including like or similar elements to those of FIGS. 11A-G, which share common reference numbers and descriptions herein. The antenna 921G includes a first plurality of outer turns 953E, a first plurality of inner turns 951E, a second plurality of outer turns 953F, and a second plurality of inner turns 951F. The source coil 925E is connected to the one or more electrical components via a first source terminal proximate to a beginning of the first plurality of outer turns 953E and a second source terminal proximate to an ending of the first plurality of inner turns 951E. The internal repeater coil 925F may be connected to a repeater tuning system 923 via a first repeater terminal proximate to a beginning of the second plurality of outer turns 953F and a second repeater terminal proximate to an ending of the second plurality of inner turns 951F. Inter-turn capacitors may 957 be connected in between the first plurality of outer turns 953E and the first plurality of inner turns 951E and in between the second plurality of outer turns 953F and the second plurality of inner turns 951F In some examples, the first and second plurality of outer turns 953E, 953F may include about 2 turns and the first and second plurality of inner turns 951E, 951F may include about 3 turns.

Figure 12A:
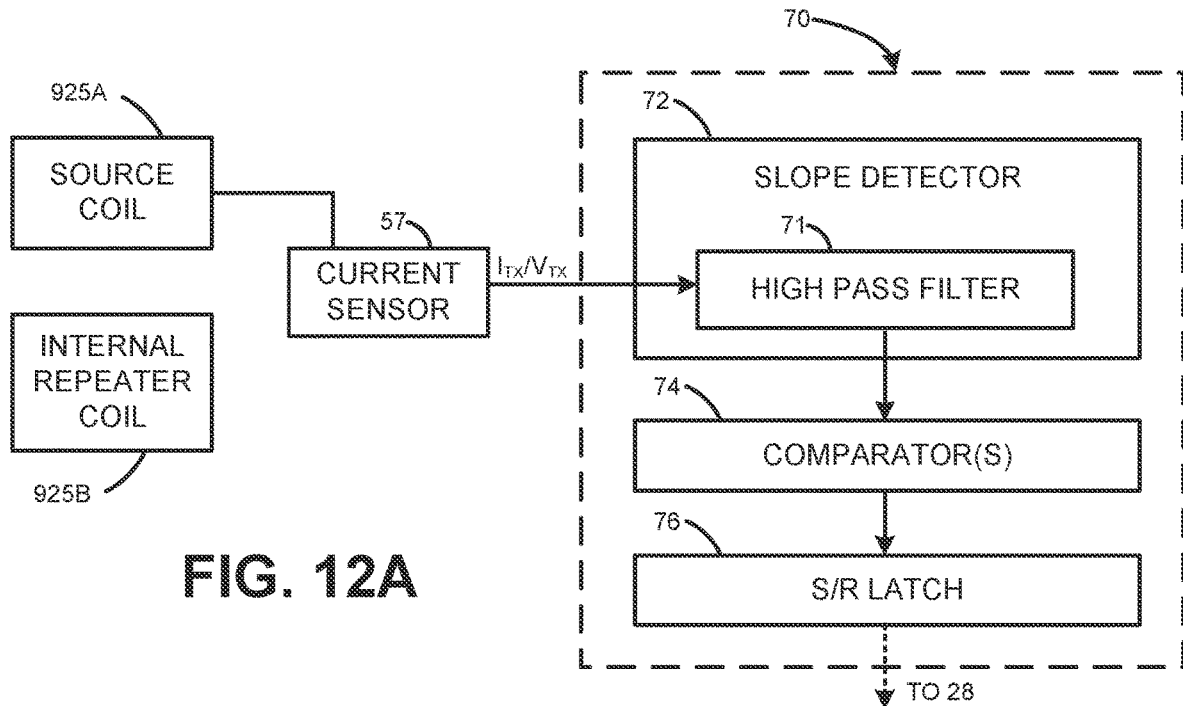
FIG. 12A is a first configuration for connecting communications circuitry of FIGS. 1-9 to a wireless transmission antenna having a source coil and an internal repeater coil, in accordance with FIGS. 1-9, 11A-H, and the present disclosure.

Turning now to FIG. 12A, a first configuration for demodulating communications at one of the source-internal repeater configured transmission antennas 921 of FIGS. 11A-H. The configuration of FIG. 12A illustrates the connection of the current sensor 57 to the source coil 925A, which then provides the electrical information of the current sensor to the demodulation circuit 70, as discussed in more detail above with respect to FIGS. 5-8. In such examples, the current sensor 57 detects the electrical information associated with AC wireless signals at the source coil 925A, rather than at the internal repeater coil 925B. Alternatively, FIG. 12B illustrates a second configuration for demodulating communications at one of the source-internal repeater configured transmission antennas 921 of FIGS. 11A-H, but wherein the current sensor 57 is connected to the internal repeater coil 925B and detects the electrical characteristics of the AC wireless signals at the internal repeater coil 925B.

Figure 12B:
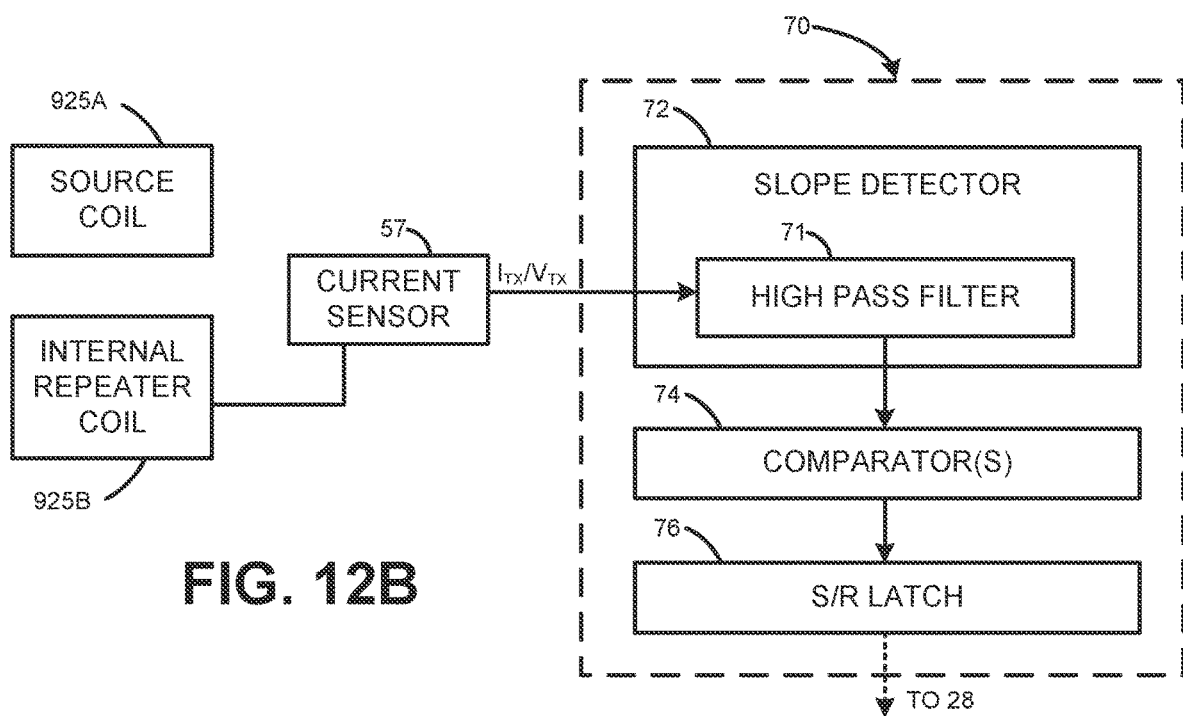
FIG. 12B is a second configuration for connecting communications circuitry of FIGS. 1-9 to a wireless transmission antenna having a source coil and an internal repeater coil, in accordance with FIGS. 1-9, 11-12A, and the present disclosure.

The configurations of FIGS. 12A and 12B may be utilized to simplify part management in the system 20, rather than including multiple demodulation circuits 70 and/or sensors 57. Additionally or alternatively, experimental results may elucidate that communications are best detected at one of the source coil 925A or the internal repeater coil 925B; thus, based on such experimental results, a designer or manufacturer of the transmission system 20 may select between the configuration of FIG. 12A and the configuration of FIG. 12B, based on which works best for their specific system.

Figure 13:
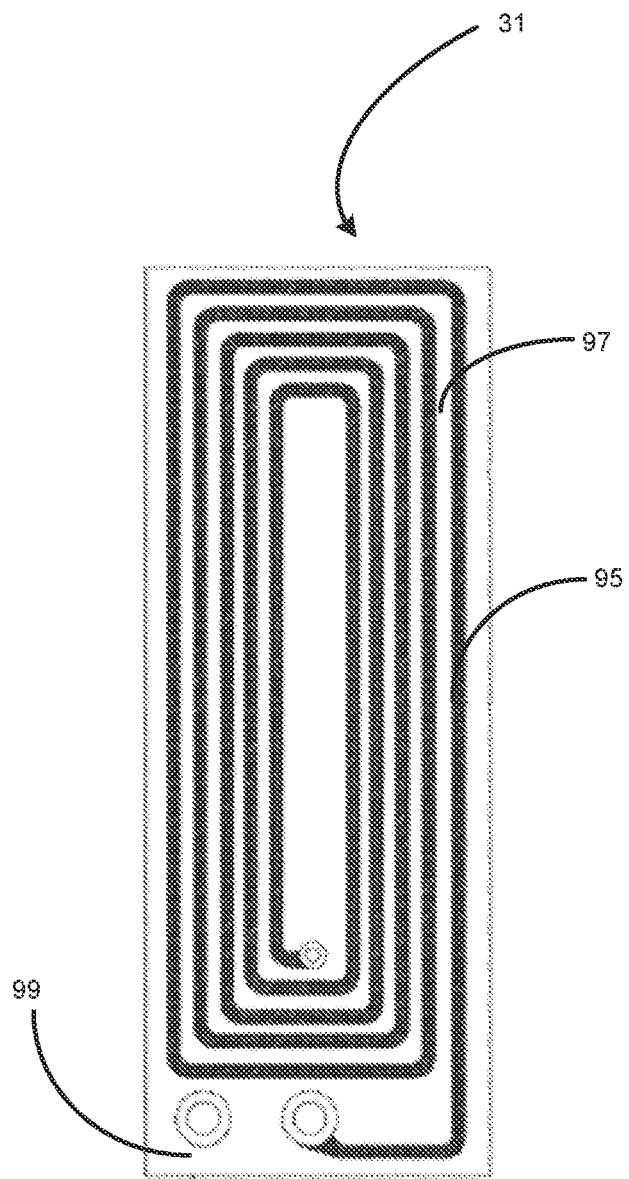
FIG. 13 is a top view of a non-limiting, exemplary antenna, for use as a receiver antenna of the system of FIGS. 1-10 and/or any other systems, methods, or apparatus disclosed herein, in accordance with the present disclosure.

FIG. 13 illustrates an example, non-limiting embodiment of the receiver antenna 31 that may be used with any of the systems, methods, and/or apparatus disclosed herein. In the illustrated embodiment, the antenna 21, 31, is a flat spiral coil configuration. Non-limiting examples can be found in U.S. Pat. Nos. 9,941,743, 9,960,628, 9,941,743 all to Peralta et al.; 9,948,129, 10,063,100 to Singh et al.; U.S. Pat. No. 9,941,590 to Luzinski; U.S. Pat. No. 9,960,629 to Rajagopalan et al.; and U.S. Patent App. Nos. 2017/0040107, 2017/0040105, 2017/0040688 to Peralta et al.; all of which are assigned to the assignee of the present application and incorporated fully herein by reference.

In addition, the antenna 31 may be constructed having a multi-layer-multi-turn (MLMT) construction in which at least one insulator is positioned between a plurality of conductors. Non-limiting examples of antennas having an MLMT construction that may be incorporated within the wireless transmission system(s) 20 and/or the wireless receiver system(s) 30 may be found in U.S. Pat. Nos. 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,898,885, 9,208,942, 9,232,893, and 9,300,046 to Singh et al., all of which are assigned to the assignee of the present application are incorporated fully herein. These are merely exemplary antenna examples; however, it is contemplated that the antennas 31 may be any antenna capable of the aforementioned higher power, high frequency wireless power transfer.

The automatic gain and bias control described herein may significantly reduce the BOM for the demodulation circuit, and the wireless transmission system as a whole, by allowing usage of cheaper, less computationally capable processor(s) for or with the transmission controller. The throughput and accuracy of an edge-detection coding scheme depends in large part upon the system's ability to quickly and accurately detect signal slope changes. These constraints may be better met in environments wherein the distance between, and orientations of, the sender and receiver change dynamically, or the magnitude of the received power signal and embedded data signal may change dynamically, via the disclosed automatic gain and bias control. This may allow reading of faint signals via appropriate gain, for example, while also avoiding saturation with respect to larger signals.

The systems, methods, and apparatus disclosed herein are designed to operate in an efficient, stable and reliable manner to satisfy a variety of operating and environmental conditions. The systems, methods, and/or apparatus disclosed herein are designed to operate in a wide range of thermal and mechanical stress environments so that data and/or electrical energy is transmitted efficiently and with minimal loss. In addition, the system 10 may be designed with a small form factor using a fabrication technology that allows for scalability, and at a cost that is amenable to developers and adopters. In addition, the systems, methods, and apparatus disclosed herein may be designed to operate over a wide range of frequencies to meet the requirements of a wide range of applications.

While illustrated as individual blocks and/or components of the wireless transmission system 20, one or more of the components of the wireless transmission system 20 may combined and/or integrated with one another as an integrated circuit (IC), a system-on-a-chip (SoC), among other contemplated integrated components. To that end, one or more of the transmission control system 26, the power conditioning system 40, the sensing system 50, the transmitter coil 21, and/or any combinations thereof may be combined as integrated components for one or more of the wireless transmission system 20, the wireless power transfer system 10, and components thereof. Further, any operations, components, and/or functions discussed with respect to the wireless transmission system 20 and/or components thereof may be functionally embodied by hardware, software, and/or firmware of the wireless transmission system 20.

Similarly, while illustrated as individual blocks and/or components of the wireless receiver system 30, one or more of the components of the wireless receiver system 30 may combined and/or integrated with one another as an IC, a SoC, among other contemplated integrated components. To that end, one or more of the components of the wireless receiver system 30 and/or any combinations thereof may be combined as integrated components for one or more of the wireless receiver system 30, the wireless power transfer system 10, and components thereof. Further, any operations, components, and/or functions discussed with respect to the wireless receiver system 30 and/or components thereof may be functionally embodied by hardware, software, and/or firmware of the wireless receiver system 30.

In an embodiment, a ferrite shield may be incorporated within the antenna structure to improve antenna performance. Selection of the ferrite shield material may be dependent on the operating frequency as the complex magnetic permeability ($\mu=\mu'-j*\mu''$) is frequency dependent. The material may be a polymer, a sintered flexible ferrite sheet, a rigid shield, or a hybrid shield, wherein the hybrid shield comprises a rigid portion and a flexible portion. Additionally, the magnetic shield may be composed of varying material compositions. Examples of materials may include, but are not limited to, zinc comprising ferrite materials such as manganese-zinc, nickel-zinc, copper-zinc, magnesium-zinc, and combinations thereof.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A wireless power transmission system comprising:
 a transmitter antenna configured to couple with at least one other antenna of at least one other system and transmit alternating current (AC) wireless signals to the at least one other antenna, the AC wireless signals including wireless power signals and wireless data signals, the wireless data signals generated by altering electrical characteristics of the AC wireless signals at the at least one other system, the transmitter antenna including a source coil and an internal repeater coil;
 at least one sensor configured to detect electrical information associated with the electrical characteristics of the AC wireless signals at the internal repeater coil, the electrical information including one or more of a current of the AC wireless signals, a voltage of the AC wireless signals, a power level of the AC wireless signals, or combinations thereof;
 a demodulation circuit configured to (i) receive the electrical information from the at least one sensor at the internal repeater coil, (ii) detect a change in the electrical information, (iii) determine if the change in the electrical information meets or exceeds one of a rise threshold or a fall threshold, (iv) if the change exceeds one of the rise threshold or the fall threshold, generate an alert, (v) and output a plurality of data alerts; and
 a transmitter controller configured to (i) receive the plurality of data alerts from the demodulation circuit, and (ii) decode the plurality of data alerts into the wireless data signals.

2. The wireless power transmission system of claim 1, wherein the at least one other system encodes the wireless data signals as one or more of a high threshold voltage and a low threshold voltage of the AC wireless signals, or combinations thereof.

3. The wireless power transmission system of claim 2, wherein the rise threshold is associated with the high threshold voltage and the fall threshold is associated with the low threshold voltage.

4. The wireless power transmission system of claim 2, wherein the wireless data signals are encoded as pulse width encoded wireless data signals.

5. The wireless power transmission system of claim 1, wherein the electrical characteristics include a voltage of the wireless power signals, and
 wherein the demodulation circuit includes a slope detector circuit configured to determine a voltage rate of change for the voltage of the wireless power signals.

6. The wireless power transmission system of claim 5, wherein the demodulation circuit includes a comparator circuit configured to (i) receive the voltage rate of change, (ii) compare the voltage rate of change to a rising rate of change, (iii) determine that the change in the electrical characteristics meets or exceeds the rise threshold, if the voltage rate of change meets or exceeds the rising rate of change, (iv) compare the voltage rate of change to a falling rate of change, and (v) determine that the change in the electrical characteristics meets or exceeds the fall threshold, if the voltage rate of change meets or exceeds the falling rate of change.

7. The wireless power transmission system of claim 6, wherein the demodulation circuit includes a set/reset (SR) latch in operative communication with the comparator circuit.

8. The wireless power transmission system of claim 1, wherein the transmitter antenna is configured to operate based on an operating frequency of about 6.78 megahertz (MHz).

9. A wireless power transmission system comprising:
 a transmitter antenna configured to couple with at least one other antenna of at least one other system and transmit alternating current (AC) wireless signals to the at least one other antenna, the AC wireless signals including wireless power signals and wireless data signals, the wireless data signals generated by altering electrical characteristics of the AC wireless signals at the at least one other system, the transmitter antenna including a source coil and an internal repeater coil;
 at least one sensor configured to detect electrical information associated with the electrical characteristics of the AC wireless signals at the source coil, the electrical information including one or more of a current of the AC wireless signals, a voltage of the AC wireless signals, a power level of the AC wireless signals, or combinations thereof;
 a demodulation circuit configured to (i) receive the electrical information from the at least one sensor at the source coil, (ii) detect a change in the electrical information, (iii) determine if the change in the electrical information meets or exceeds one of a rise threshold or a fall threshold, (iv) if the change exceeds one of the rise threshold or the fall threshold, generate an alert, (v) and output a plurality of data alerts; and
 a transmitter controller configured to (i) receive the plurality of data alerts from the demodulation circuit, and (ii) decode the plurality of data alerts into the wireless data signals.

10. The wireless power transmission system of claim 9, wherein the at least one other system encodes the wireless data signals as one or more of a high threshold voltage and a low threshold voltage of the AC wireless signals, or combinations thereof.

11. The wireless power transmission system of claim 10, wherein the rise threshold is associated with the high threshold voltage and the fall threshold is associated with the low threshold voltage.

12. The wireless power transmission system of claim 11, wherein the wireless data signals are encoded as pulse width encoded wireless data signals.

13. The wireless power transmission system of claim 9, wherein the electrical characteristics include a voltage of the wireless power signals, and
 wherein the demodulation circuit includes a slope detector circuit configured to determine a voltage rate of change for the voltage of the wireless power signals.

14. The wireless power transmission system of claim 13, wherein the demodulation circuit includes a comparator circuit configured to (i) receive the voltage rate of change, (ii) compare the voltage rate of change to a rising rate of change, (iii) determine that the change in the electrical characteristics meets or exceeds the rise threshold, if the voltage rate of change meets or exceeds the rising rate of change, (iv) compare the voltage rate of change to a falling rate of change, and (v) determine that the change in the electrical characteristics meets or exceeds the fall threshold, if the voltage rate of change meets or exceeds the falling rate of change.

15. The wireless power transmission system of claim 14, wherein the demodulation circuit includes a set/reset (SR) latch in operative communication with the comparator circuit.

16. The wireless power transmission system of claim 9, wherein the transmitter antenna is configured to operate based on an operating frequency of about 6.78 megahertz (MHz).

17. A wireless power transmission system comprising:
- a transmitter antenna configured to couple with at least one other antenna of at least one other system and transmit alternating current (AC) wireless signals to the at least one other antenna, the AC wireless signals including wireless power signals and wireless data signals, the wireless data signals generated by altering electrical characteristics of the AC wireless signals at the at least one other system, the transmitter antenna including a source coil and an internal repeater coil;
- at least one sensor configured to detect electrical information associated with the electrical characteristics of the AC wireless signals, the electrical information including one or more of a current of the AC wireless signals, a voltage of the AC wireless signals and a power level of the AC wireless signals;
- a demodulation circuit configured to (i) receive the electrical information from the at least one sensor, (ii) apply automatic bias control and gain control to the electrical information to generate a modified electrical information signal (iii) detect a change in the modified electrical information signal, (iv) determine if the change in the modified electrical information signal meets or exceeds one of a rise threshold or a fall threshold, (v) if the change exceeds one of the rise threshold or the fall threshold, generate an alert, (vi) and output a plurality of data alerts; and
- a transmitter controller configured to (i) receive the plurality of data alerts from the demodulation circuit, and (ii) decode the plurality of data alerts into the wireless data signals.

18. The wireless power transmission system of claim 17, wherein the at least one sensor is configured to detect the electrical information at the source coil of the transmitter antenna.

19. The wireless power transmission system of claim 17, wherein the at least one sensor is configured to detect the electrical information at the internal repeater coil of the transmitter antenna.

20. The wireless power transmission system of claim 17, wherein the transmitter antenna is configured to operate based on an operating frequency of about 6.78 megahertz (MHz).

* * * * *